US012799276B2

(12) United States Patent
Zhong et al.

(10) Patent No.: US 12,799,276 B2
(45) Date of Patent: Nov. 17, 2026

(54) SOLUBLE POLYIMIDES AND DIIMIDES FOR SPIN-ON CARBON APPLICATIONS

(71) Applicant: Brewer Science, Inc., Rolla, MO (US)

(72) Inventors: Xing-Fu Zhong, Rolla, MO (US); Runhui Huang, Rolla, MO (US); Gu Xu, Rolla, MO (US); Sean Simmons, Columbia, MO (US); Daniel Sweat, Rolla, MO (US); Jakub Koza, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 1167 days.

(21) Appl. No.: 17/396,167

(22) Filed: Aug. 6, 2021

(65) Prior Publication Data

US 2022/0041810 A1 Feb. 10, 2022

Related U.S. Application Data

(60) Provisional application No. 63/063,623, filed on Aug. 10, 2020.

(51) Int. Cl.

| | |
|---|---|
| ***G03F 7/038*** | (2006.01) |
| ***C08G 73/10*** | (2006.01) |
| ***C09D 179/08*** | (2006.01) |
| ***G03F 7/039*** | (2006.01) |
| ***G03F 7/09*** | (2006.01) |
| ***H10P 76/20*** | (2026.01) |

(52) U.S. Cl.

CPC ....... *C08G 73/1082* (2013.01); *C09D 179/08* (2013.01); *G03F 7/0387* (2013.01); *G03F 7/039* (2013.01); *G03F 7/094* (2013.01); *H10P 76/204* (2026.01); *C08G 2150/00* (2013.01)

(58) Field of Classification Search

CPC ........ G03F 7/0387; G03F 7/038; G03F 7/039; G03F 7/094

See application file for complete search history.

(56) References Cited

U.S. PATENT DOCUMENTS

| | | | |
|---|---|---|---|
| 4,276,407 | A | 6/1981 | Bilow et al. |
| 4,555,563 | A | 11/1985 | Hefner, Jr. et al. |
| 5,772,925 | A | 6/1998 | Watanabe et al. |
| 7,157,204 | B2 | 1/2007 | Jung et al. |
| 8,895,230 | B2 | 11/2014 | Krishnamurthy et al. |
| 10,527,942 | B2 | 1/2020 | Sim et al. |
| 11,643,493 | B2 | 5/2023 | Kumazawa et al. |
| 2003/0207215 | A1* | 11/2003 | Xu .......................... C08F 22/20 430/290 |
| 2007/0083016 | A1 | 4/2007 | Dueber et al. |
| 2011/0269265 | A1* | 11/2011 | Shukla ...................... C09B 5/62 257/E51.025 |
| 2012/0034419 | A1 | 2/2012 | Washburn et al. |
| 2013/0089716 | A1 | 4/2013 | Krishnamurthy et al. |
| 2015/0325525 | A1 | 11/2015 | Singh |
| 2016/0222165 | A1 | 8/2016 | Wakita et al. |
| 2018/0046081 | A1 | 2/2018 | Miyake et al. |
| 2020/0166844 | A1 | 5/2020 | Okada et al. |
| 2020/0332062 | A1 | 10/2020 | Kori et al. |
| 2020/0333709 | A1* | 10/2020 | Kori .................. H01L 21/31058 |
| 2020/0348592 | A1 | 11/2020 | Kaitz et al. |
| 2020/0348595 | A1 | 11/2020 | Nakafuji et al. |
| 2021/0040290 | A1 | 2/2021 | Sato et al. |

FOREIGN PATENT DOCUMENTS

| | | | |
|---|---|---|---|
| CN | 106046712 | 10/2016 | |
| CN | 107787520 A | 3/2018 | |
| JP | 04-024940 | 1/1992 | |
| JP | 8-12940 | 1/1996 | |
| JP | 2004-241602 A * | 8/2004 | ........... H01L 21/304 |
| JP | 2010-122297 | 6/2010 | |
| JP | 2013-137334 | 7/2013 | |
| JP | 5417364 B2 | 2/2014 | |
| WO | 2018/212116 | 11/2018 | |
| WO | WO2021117762 A1 | 6/2021 | |

OTHER PUBLICATIONS

English Translation of JP 2004-241602 (Year: 2004).*
Office Action (Japanese language) dated Jan. 23, 2024 in corresponding Japanese Patent Application No. 2023-508515, 5 pages.
Office Action (English language) dated Jan. 23, 2024 in corresponding Japanese Patent Application No. 2023-508515, 7 pages.
Machine Translation of JP2013-137334, 28 pages.
Machine Translation of JP2010-122297, 32 pages.
Supplementary European Search Report dated Sep. 12, 2024 in corresponding European Patent Application No. 21856496.1, 9 pages.
Machine Translation of JP5417364, 32 pages.
Office Action (Chinese language) dated Sep. 14, 2024 in corresponding Chinese Patent Application No. 202180056477.X, 11 pages.
Office Action (English language) dated Sep. 14, 2024 in corresponding Chinese Patent Application No. 202180056477.X, 11 pages.
Machine Translation of CN107787520, 13 pages.
International Search Report and Written Opinion mailed Nov. 29, 2021 in corresponding PCT/US2021/045164 filed Aug. 9, 2021, 11 pages.
Machine Translation of CN106046712, 9 pages.
Machine Translation of JP04-024940, 5 pages.

(Continued)

*Primary Examiner* — Daborah Chacko-Davis

(74) *Attorney, Agent, or Firm* — HOVEY WILLIAMS LLP

(57) ABSTRACT

A high-temperature-stable spin-on-carbon ("SOC") material that fills topography features on a substrate while planarizing the surface in a one-step, thin layer coating process is provided. The material comprises low molecular weight polyimides or diimides that are pre-imidized in solution rather than on the wafer. The SOC layers can survive harsh CVD conditions and are also SC1 resistant, especially on TiN and SiOx surfaces.

43 Claims, 10 Drawing Sheets

(56) References Cited

OTHER PUBLICATIONS

Office Action dated Jun. 17, 2025 in corresponding Japanese Patent Application No. 2024-090868, 3 pages.
Machine Translation of Office Action dated Jun. 17, 2025 in corresponding Japanese Patent Application No. 2024-090868, 3 pages.
Office Action (Chinese language) dated Jul. 23, 2025 in corresponding Chinese Patent Application No. 202180056477.X, 7 pages.
Machine Translation of Office Action dated Jul. 23, 2025 in corresponding Chinese Patent Application No. 202180056477.X, 9 pages.

* cited by examiner

SOLUBLE POLYIMIDES AND DIIMIDES FOR SPIN-ON CARBON APPLICATIONS

RELATED APPLICATIONS

The present application claims the priority benefit of U.S. Provisional Patent Application Ser. No. 63/063,623, filed Aug. 10, 2020, entitled SOLUBLE POLYIMIDES AND DIIMIDES FOR SPIN-ON CARBON APPLICATIONS, incorporated by reference in its entirety herein.

BACKGROUND

Field

This invention relates in general to methods of fabricating microelectronic structures.

Description of Related Art

As feature size becomes smaller and smaller according to Moore's law, photolithography of semiconductor devices has moved to multilayer patterning. This method involves patterning multiple layers on top of each other, such as a photoresist layer on top of a hardmask layer on top of a spin-on-carbon ("SOC") layer, in order to increase the etch resistance for smaller features. As each layer is deposited and patterned, depositing a uniform, planarizing layer of material on top of it becomes critical for accurate pattern transfer and critical dimension ("CD") control.

When a hardmask layer is deposited by chemical vapor deposition ("CVD"), an SOC layer having high-temperature stability is required. Polyimides are known to be thermally stable polymers. They are usually coated on substrates as polyamic acid precursors. During baking, usually at 200-300° C., the polyamic acid precursors are converted to polyimides, during which the coating thickness typically shrinks due to loss of water and other small molecules. At the same time, the polymers are crosslinked by intermolecular imidization and other side reactions. Both the coating shrinkage and the crosslinking can be detrimental to the planarization, since the shrinkage makes the material in trenches/vias area, where there is more SOC material, "sink" more than the material in open area or on top of lines, where there is less SOC material. This results in an increased bias between these two areas, thus negatively impacting the planarization. Unfortunately, thermal reflow is limited because the polyamic acids are crosslinked prematurely by intermolecular imidization and other side reactions, which quickly turns the material from a fluid state to a gel state or solid state.

Additionally, the SOC is often coated onto substrates either formed from or coated with $SiO_2$, TiN, and other metals. Dry etching is a frequently preferred method to transfer the pattern to the substrate, however, the plasma used in a dry etch process can damage thin oxide and nitride layers. Therefore, wet etching is often used for pattern transfer to the substrates when thin oxide or nitride layers are present. Wet etching of titanium nitride (TiN) is performed at mild temperatures (50-70° C.) in SC1 cleaning solution, which is an aqueous solution of ammonium hydroxide and hydrogen peroxide. One problem with such wet etching is the undesired etching of TiN in the protected area by undercutting of the SOC layer due to its weak adhesion to TiN. This undesired etching becomes increasingly more problematic as critical dimensions continue to be reduced.

Prior art SOCs formed from polyamic acids are also insoluble in the common solvent PGMEA, which is used in photoresists, hardmasks, and other SOC solutions. Due to the insolubility, the prior art SOCs may precipitate in the coating equipment, leading to blockages in the spin coater drain lines and/or deposits in waste tanks.

SUMMARY

In one embodiment, the present disclosure is broadly concerned with a method of forming a microelectronic structure. The method comprises optionally forming one or more intermediate layers on a substrate surface. There is an uppermost intermediate layer on the substrate surface, if one or more intermediate layers are present. A composition is applied to the uppermost intermediate layer, if present, or to the substrate surface, if no intermediate layers are present. The composition comprises one or both of a diimide or a polyimide dissolved or dispersed in a solvent system. The composition is heated to form a carbon-rich layer, with the carbon-rich layer having the property of presenting fewer than about 0.1 defects/$cm^2$ of layer surface area if subjected to a CVD survivability test. The CVD survivability test that is used to determine if this property exists comprises forming a SiOx or SiNx layer on the carbon-rich layer via plasma-enhanced chemical vapor deposition ("PECVD") at about 400° C. under vacuum and observing the SiOx or SiNx layer for defects.

In another embodiment, a method of forming a microelectronic structure is disclosed where one or more intermediate layers are optionally formed on a substrate surface, there being an uppermost intermediate layer on the substrate surface, if one or more intermediate layers are present. A composition is applied to the uppermost intermediate layer, if present, or to the substrate surface, if no intermediate layers are present. The composition comprises one or both of a diimide or a polyimide dissolved or dispersed in a solvent system. The composition is heated to form a carbon-rich layer having the property of SC1 resistance.

In a further embodiment, a method of forming a microelectronic structure is provided where the method comprises optionally forming one or more intermediate layers on a substrate surface. There is an uppermost intermediate layer on the substrate surface, if one or more intermediate layers are present. A composition is applied to the uppermost intermediate layer, if present, or to the substrate surface, if no intermediate layers are present. The composition comprises one or both of a diimide or a polyimide and a component dissolved or dispersed in a solvent system. The component is chosen from polyphenols comprising at least four phenol rings, polyhydroxy compounds, phosphoric compounds, and combinations of the foregoing. The composition is heated to form a carbon-rich layer.

In yet a further embodiment, the invention provides a method of forming a microelectronic structure where the method comprises imidizing one or both of a diamic acid or a polyamic acid in a solvent system comprising propylene glycol monomethyl ether so as to form a composition comprising one or both of a diimide or a polyimide. One or more intermediate layers are optionally formed on a substrate surface, there being an uppermost intermediate layer on the substrate surface, if one or more intermediate layers are present. Without removing any of the propylene glycol monomethyl ether, the composition is applied to the uppermost intermediate layer, if present, or to the substrate surface, if no intermediate layers are present. The composition is heated to form a carbon-rich layer.

The invention also provides a method of forming a microelectronic structure where the method comprises optionally forming one or more intermediate layers on a substrate surface, there being an uppermost intermediate layer on the substrate surface, if one or more intermediate layers are present. A composition is applied to the uppermost intermediate layer, if present, or to the substrate surface, if no intermediate layers are present. The composition comprises a polyimide dissolved or dispersed in a solvent system and having a weight average molecular weight of about 2,000 Daltons to about 7,000 Daltons. The composition is heated to form a carbon-rich layer.

In another embodiment, a composition is provided, with the composition comprising:

- a diimide
- a component chosen from:
  - polyphenols comprising at least four phenol rings;
  - polyhydroxy compounds;
  - phosphoric compounds; and
  - combinations of the foregoing; and
- a solvent system.

In another embodiment, a microelectronic structure comprising a microelectronic substrate having a surface is provided. There is optionally one or more intermediate layers on the substrate surface, there being an uppermost intermediate layer on the substrate surface, if one or more intermediate layers are present. A layer of a composition is on the uppermost intermediate layer, if present, or on the substrate surface, if no intermediate layers are present. The composition comprises:

- one or both of a diimide or a polyimide;
- a component chosen from:
  - polyphenols comprising at least four phenol rings;
  - polyhydroxy compounds;
  - phosphoric compounds; and
  - combinations of the foregoing; and
- a solvent system.

In yet a further embodiment, the invention provides a microelectronic structure comprising a microelectronic substrate having a surface. There is optionally one or more intermediate layers on the substrate surface, there being an uppermost intermediate layer on the substrate surface, if one or more intermediate layers are present. A carbon-rich layer is on the uppermost intermediate layer, if present, or on the substrate surface, if no intermediate layers are present. The carbon-rich layer comprises:

- one or both of a crosslinked diimide or a crosslinked polyimide; and
- a component chosen from:
  - polyphenols comprising at least four phenol rings;
  - polyhydroxy compounds;
  - phosphoric compounds; and
  - combinations of the foregoing.

DETAILED DESCRIPTION

Figure 1:
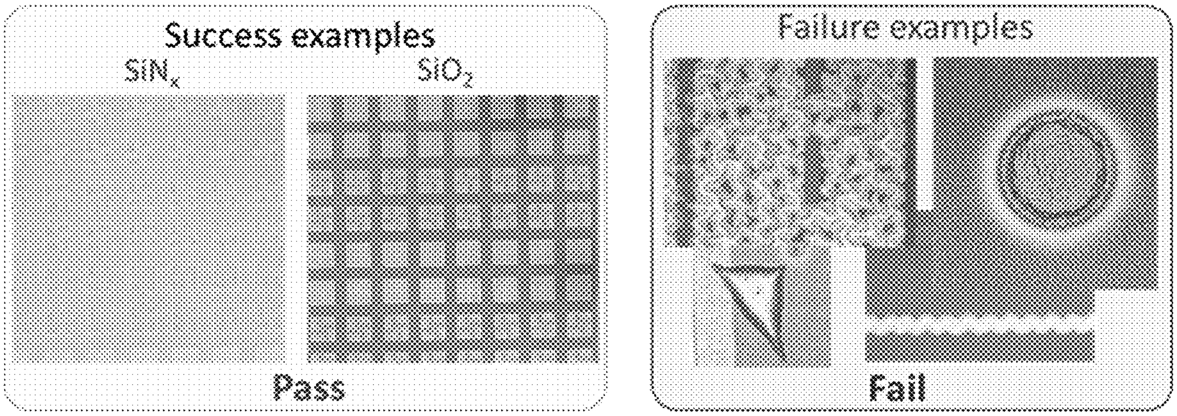
FIG. 1 are optical microscope photographs (500× on left and 2,000× on right) showing examples of CVD survivability test results.

The present disclosure is broadly concerned with high-temperature-stable spin-on carbon compositions that are especially suitable for multilayer photolithography applications, as well as methods of using those compositions and the resulting structures.

Compositions

The compositions generally comprise a diimide and/or a polyimide dispersed or dissolved in a solvent system, along with one or more optional ingredients, depending upon the embodiment.

1. Polyimides

In one embodiment, commercially available polyimides can be utilized. In another embodiment, the polyimide can be synthesized by imidizing a polyamic acid in solution. That polyamic acid can be a commercially obtained polyamic acid, or it can be synthesized, such as by reacting one or more dianhydrides and one or more diamines in an appropriate reaction solvent system, which can include only one solvent or multiple solvents.

In embodiments where the polyamic acid is synthesized, suitable dianhydrides comprise aromatic moieties, with preferred aromatic dianhydrides having flexible structures.

"Flexible structures" as used herein describes structures with aliphatic linkages that allow the bonds in the structure to rotate and flex. Examples of such dianhydrides include those chosen from benzophenone-3,3'4,4'-tetracarboxylic dianhydride ("BTDA"), 4,4'-biphthalic dianhydride, 4,4'-oxydiphthalic dianhydride, 9,9-bis(3,4-dicarboxyphenyl)fluorene dianhydride ("FDAH"), and combinations thereof.

Suitable diamines for polyamic acid synthesis comprise aromatic moieties, with preferred aromatic diamines having flexible structures. Examples of such diamines include those chosen from 4,4'-oxydianiline ("ODA"), bis(4-aminophenyl)sulfone, 9,9-bis(4-aminophenyl)fluorene ("FDA"), and combinations thereof.

Polymerization can be carried out in any suitable reaction solvent systems, examples of which are chosen from dimethylformamide ("DMF"), dimethylacetamide ("DMAC"), N-methyl-2-pyrrolidone ("NMP"), gamma-butyrolactone ("GBL"), propylene glycol monomethyl ether acetate ("PGMEA"), propylene glycol monomethyl ether ("PGME"), propylene glycol ethyl ether ("PGEE"), cyclopentanone, and combinations thereof. In one embodiment, fab-friendly solvents such as PGMEA, PGME, and/or PGEE are used. In another embodiment, the reaction or polymerization solvent system consists essentially of, or even consists of, PGMEA, PGME, and/or PGEE. In another embodiment, this solvent system is essentially free of DMF, DMAC, NMP, and/or GBL. In other words, the solvent system comprises less than about 5%, preferably less than about 1%, and more preferably about 0% of one or more of DMF, DMAC, NMP, and/or GBL, and even more preferably of the combination of DMF, DMAC, NMP, and/or GBL.

In embodiments where it is desirable to obtain polyamic acids with amino terminal groups (or at least primarily amino terminal groups), the ratio of dianhydride to diamine utilized is preferably about 1:3 to about 4:5, and more preferably about 1:3 to about 2:3. In embodiments where it is desirable to obtain polyamic acids with anhydride terminal groups (or at least primarily anhydride terminal groups), the ratio of dianhydride to diamine is preferably from about 4:3 to about 14:3, and more preferably from about 5:3 to about 10:3. In either embodiment, it is preferred that the polyamic acids have a weight average molecular weight of about 500 Daltons to about 9,000 Daltons, and preferably about 2,000 Daltons to about 7,000 Daltons, as determined by GPC.

The dianhydride and diamine monomers are preferably dissolved or dispersed in the reaction solvent in an amount of about 5% by weight to about 20% by weight, more preferably about 7% by weight to about 15% by weight, and most preferably about 10% by weight, based upon the total weight of the reaction system by weight. A polycondensation reaction is carried out under nitrogen with stirring at a temperature of about 10° C. to about 40° C., and preferably about 20° C. to about 30° C., for about 12 hours to about 36 hours, and preferably from about 16 hours to about 24 hours.

Next, the polyamic acids are preferably endcapped, which can prolong the shelf life of the final polyimides, improve spin bowl compatibility, and increase thermal stability by introducing crosslinkable groups. In embodiments where the polyamic acids are terminated with amino groups, the endcapper is preferably an anhydride such as those selected from the group consisting of acetic anhydride, phthalic anhydride ("PTA"), succinic anhydride, trimellitic anhydride, 1,2-cyclohexanedicarboxylic anhydride, 4-cyclohexene-1,2-dicarboxylic anhydride, 5-norbornene-2,3-dicarboxylic anhydride, 4-ethynyl phthalic anhydride ("EPA"), 4-methylethynyl phthalic anhydride ("MEPA"), 4-phenylethynyl phthalic anhydride ("PEPA"), and combinations thereof.

In embodiments where the polyamic acids are terminated with anhydride groups, the endcapper is preferably a compound comprising an amino group, such as aniline. Compounds comprising an aniline moiety are particularly preferred, including those chosen from 2,5-dimethoxyaniline, 3,5-dimethoxyaniline, 3,4,5-trimethoxyaniline, 5-amino-1-naphthol, 4'-aminoacetophenone, 1-aminoanthraquinone, 3-ethynylaniline, 4-ethynylaniline, 2-ethynylaniline, and combinations thereof.

The molar ratio of the endcapper to the predominant end group (i.e., anhydride endcapper to terminal amino groups, or amino group endcapper to terminal anhydride groups) depends on the initial molar ratio of dianhydride to diamine, and it is selected in such a way that the endcapper reacts completely (or at least substantially completely) with the terminal groups. For an anhydride endcapper, the molar ratio can be calculated as $$E/B = 2(1 - A/B)$$

where A is the moles of dianhydride, B is the moles of diamine, and E is the moles of anhydride endcapper. For example, if the initial molar ratio of dianhydride (A) to diamine (B) is about 2:5, then the molar ratio of anhydride endcapper (E) to diamine (B) is selected to be about 6:5, or if the initial molar ratio of dianhydride (A) to diamine (B) is about 3:5, then the molar ratio of anhydride endcapper (E) to diamine (B) is selected to be about 4:5.

Similarly, for an amino group endcapper, the molar ratio can be calculated as $$F/A = 2(1 - B/A)$$

where A is the moles of dianhydride, B is the moles of diamine, and F is the moles of amino group endcapper. (The factor of "2" is required because the monomers are difunctional anhydrides and difunctional amines, while the endcappers are monofunctional anhydrides or monofunctional amines.)

Regardless of the endcappers selected, the endcapping reaction is carried out under nitrogen with stirring at a temperature of about 10° C. to about 40° C., and preferably about 20° C. to about 30° C., for about 12 hours to about 36 hours, and more preferably about 16 hours to 24 hours.

Next, the polymer or endcapped polymer (depending upon whether endcapping was utilized) is imidized by using a dehydration reaction to convert the polyamic acid to a polyimide. The removal of water by azeotropic distillation is desirable for complete imidization since the dehydration/hydrolysis reactions are reversible. The removal of water drives the equilibrium forward to complete imidization. A solvent that is able to distill azeotropically with water, such as toluene or xylene, is then added to the reaction mixture in an amount of about 10% by weight to about 40% by weight, and preferably about 20% by weight to about 30% by weight, based on the total weight of the reaction mixture as a whole taken as 100% by weight. The mixture is heated in an inert atmosphere, such as under nitrogen, at a temperature of about 150° C. to about 200° C., preferably about 170° C.

to about 190° C., and more preferably at about 180° C. The distillation solvent (e.g., toluene, xylene) distills off, along with water, and is condensed and collected, such as in a Dean Stark collector. Water is then phase separated from the distillation solvent, and sinks to the bottom of the collector, while the distillation solvent flows back into the reaction vessel. The imidization is allowed to proceed for a time of about 4 hours to about 24 hours, preferably about 8 hours to about 16 hours, or until the collection of water stops.

The crude polyimide solution is then cooled to room temperature. In one embodiment, the polyimide is precipitated from the reaction solution, preferably in methanol or methanol/acetone mixtures at about a 1:5 weight ratio. The precipitated polyimide is filtered and washed, preferably with methanol, acetone, or a combination thereof. The obtained polyimide can be air-dried or dried in a vacuum, preferably at a temperature of about 60° C. for a time of about 10 hours to about 24 hours.

In another embodiment, the polyimide is not precipitated from the reaction solution. That is, advantageously, when fab-friendly solvents as discussed previously are used as the reaction solvent system, the crude polyimide solution can be used as-obtained, and no additional precipitation is necessary.

In one embodiment, the resulting polyimides have a weight average molecular weight of about 500 Daltons to about 9,000 Daltons, and preferably about 2,000 Daltons to about 7,000 Daltons, as determined by GPC. In another embodiment, the resulting polyimides have a weight average molecular weight of about 450 Daltons to about 8,100 Daltons, and preferably about 1,800 Daltons to about 6,300 Daltons, as determined by GPC.

2. Diimides

In one embodiment, commercially available diimides can be utilized. In another embodiment, the diimide can be synthesized by imidizing a diamic acid in solution. That diamic acid can be a commercially obtained diamic acid, or it can be synthesized, such as by reacting one or more dianhydrides with one or more monoamines, or by reacting one or more monoanhydrides with one or more diamines, in an appropriate reaction solvent system, which can include only one solvent or multiple solvents.

In one embodiment where the diamic acid is synthesized, one or more dianhydrides and one or more monoamines (preferably crosslinkable) are reacted in a solvent system. Suitable dianhydrides include those chosen from benzophenone-3,3'4,4'-tetracarboxylic dianhydride, 4,4'-oxydiphthalic dianhydride, 9,9-bis(3,4-dicarboxyphenyl)fluorene dianhydride, and combinations thereof. Suitable monoamino compounds are preferably crosslinkable and include those chosen from 2-vinylaniline, 4-vinylaniline, 2-allylaniline, 4-allylaniline, 3-ethynylaniline, 4-ethynylaniline, 2-ethynylaniline, and combinations thereof. Suitable reaction solvents include those discussed previously with the polyimide embodiment, again with fab-friendly solvents such as PGMEA, PGME, and/or PGEE being preferred. The molar ratio of the crosslinkable monoamino compound to dianhydride is preferably about 2:1 to about 2.2:1, and more preferably about 2:1 to about 2.1:1.

In another embodiment where the diamic acid is synthesized, it is formed by reacting one or more diamines with one or more monoanhydrides in a solvent system. Suitable diamines include those chosen from 4,4'-oxydianiline, bis (4-aminophenyl)sulfone, 9,9-bis(4-aminophenyl)fluorene, and combinations thereof. Suitable monoanhydride compounds are preferably crosslinkable and include those chosen from maleic anhydride, 4-cyclohexene-1,2-dicarboxylic anhydride, 5-norbornene-2,3-dicarboxylic anhydride, 4-ethynyl phthalic anhydride ("EPA"), 4-methylethynyl phthalic anhydride ("MEPA"), 4-phenylethynyl phthalic anhydride ("PEPA"), and combinations thereof. Again, suitable reaction solvents include those discussed previously with the polyimide embodiment, with fab-friendly solvents such as PGMEA or PGME being preferred. The molar ratio of the monoanhydride compound to diamine is preferably from about 2:1 to about 2.2:1, and more preferably from about 2:1 to about 2.1:1.

In one embodiment, the reaction solvent system consists essentially of, or even consists of, PGMEA, PGME, and/or PGEE. In another embodiment, this solvent system is essentially free of DMF, DMAC, NMP, and/or GBL. In other words, the solvent system comprises less than about 5% by weight, preferably less than about 1% by weight, and more preferably about 0% by weight of one or more of DMF, DMAC, NMP, or GBL. Additionally or alternatively, the total combined weight of DMF, DMAC, NMP, and GBL in the solvent system is less than about 5% by weight, preferably less than about 1% by weight, and more preferably about 0% by weight.

Regardless, the reaction is carried out similarly to that described above with respect to the polyimide embodiment, with a couple of differences, as described below. This reaction is also carried out under nitrogen with stirring, preferably at a temperature of about 10° C. to about 50° C., and more preferably about 20° C. to about 40° C., for about 12 hours to about 36 hours, and more preferably about 16 to 24 hours.

Next, the diamic acid is imidized by using a dehydration reaction to convert the diamic acid to a diimide. The removal of water by azeotropic distillation is preferred for the complete imidization since the dehydration/hydrolysis reactions are reversible. The removal of water drives the equilibrium forward to complete imidization. In one embodiment, a solvent that is able to distill azeotropically with water, such as toluene or xylene, is added to the reaction mixture in an amount of about 10% by weight to about 40% by weight, preferably about 20% by weight to about 30% by weight as a percentage of the weight of the reaction mixture as a whole. The mixture is heated in an inert atmosphere, such as under nitrogen, at a temperature of about 100° C. to about 200° C., and preferably about 130° C. to about 180° C. The distillation solvent (e.g., toluene, xylene) distills off along with water, and is condensed and collected, such as in a Dean Stark collector. Water is then phase separated from the distillation solvent, and sinks to the bottom of the collector, while the distillation solvent flows back into the reaction vessel. In another embodiment, the rapid kinetics of the imidization reaction are such that no distillation solvent is necessary. The imidization is allowed to proceed for a time of about 4 hours to about 24 hours, and preferably about 8 hours to about 16 hours, or until the collection of water stops.

The crude diimide solution is then cooled to room temperature and precipitated from the reaction solution. It is preferably precipitated in deionized water or hexanes at about a 1:5 weight ratio. The precipitated diimide is filtered and washed, preferably with water, hexanes, or a combination thereof. The obtained diimide can be air-dried or dried in a vacuum, preferably at a temperature of about 60° C. for about 10 hours to about 24 hours.

In another embodiment, the diimide is not precipitated from the reaction solution. That is, advantageously, when fab-friendly solvents are used as the reaction solvent system, the crude polyimide solution can be used as-obtained, and no additional precipitation is necessary.

Regardless of the embodiment, the formed diimides preferably have a weight average molecular weight of preferably less than about 1,000 Daltons, more preferably from about 500 Daltons to about 1,000 Daltons, and even more preferably from about 600 Daltons to about 800 Daltons.

3. Composition Formulations

In both the polyimide and diimide embodiments, the inventive compositions comprise the above-described polyimide and/or diimide dispersed or dissolved in a solvent system. In either embodiment, each composition may individually contain optional ingredients, such as those chosen from crosslinkers, surfactants, polymers, catalysts, additives, and mixtures thereof.

In each of the foregoing compositions, the polyimide and/or diimide will preferably be present in the particular composition from about 2% by weight to about 50% by weight solids, more preferably about 3% by weight to about 30% by weight solids, and even more preferably about 5% by weight to about 10% by weight solids, based upon the total weight of the composition taken as 100% by weight.

In one embodiment, one or more additives may be included in the composition. One suitable additive is chosen from polyphenols, and particularly those comprising four, five, six, or more phenol rings. In one embodiment, the polyphenol comprises at least two unsubstituted phenol rings.

Some preferred polyphenols are those disclosed by US 2021/0040290, incorporated by reference herein, and those supplied by Mitsubishi Gas Chemical Company under the tradenames of NeoFARIT 7177C and 7177D ("NF7177C" and "NF7177D"). A particularly preferred polyphenol comprises:

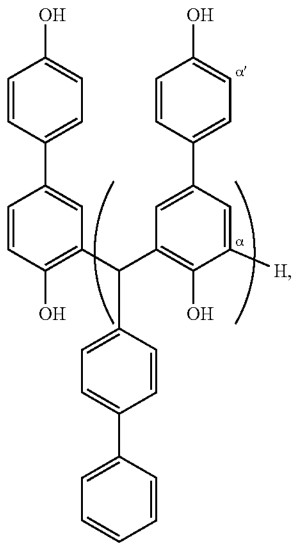

where n is 1 to 5. In the above structure, the repeat unit is shown bonded to carbon α. In some embodiments, the repeat unit can be bonded to carbon α' instead of a. In other embodiments, both carbon α and carbon α' can include the repeat units, and each n is individually chosen from 1 to 5.

Another suitable additive includes hydroxy compounds, and particularly polyhydroxy compounds. In one embodiment, preferred hydroxy compounds have 3 or more hydroxy groups, and more preferably 3 to 6 hydroxy groups. In another embodiment, the hydroxy compound comprises an aromatic moiety (e.g., benzene ring) substituted with those hydroxy groups. Examples of suitable hydroxy compounds include those chosen from gallic acid, methyl gallate, 4-hydroxybenzoic acid, 1,2-dihydroxy benzene, pyrogallol, 2,3,4,3',4',5'-hexahydroxybenzophenone ["6HBP"], 3,3', 5,5'-tetrakis(methoxymethyl)-[1,1'-biphenyl]-4,4'-diol [TMOM-BP], poly(4-vinyl phenol), and combinations thereof.

Phosphoric compounds are another type of additive that can be used in some embodiments of the inventive compositions. Preferred phosphoric compounds comprise phosphine, phosphine oxide, phosphonate, and/or phosphate groups. Examples of suitable phosphoric compounds include those chosen from phenylbis(2,4,6-trimethylbenzoyl)phosphine oxide, dimethyl phenyl phosphonate, phenyl phosphate, phenyl phosphonic acid, phytic acid, and combinations thereof.

Each additive that has been included is preferably individually present in the particular composition at levels of about 0.5% to about 10% by weight solids, and more preferably about 1% to about 3% by weight solids, based upon the total weight of the solids taken as 100% by weight. Alternatively or additionally, the total weight of the combination of all additives present preferably falls into the foregoing ranges.

In some embodiments, a surfactant may be included in the composition to improve coating quality. Nonionic surfactants such as R30N (DIC Corporation, Japan) and FS3100 (The Chemours Company FC, LLC. USA) are especially preferred. The surfactant is preferably present in the particular composition about 0.05% to about 0.5% by weight solids, and more preferably about 0.1% to about 0.3% by weight solids, based upon the total weight of the solids taken as 100% by weight.

The above ingredients (polyimide and/or diimide along with any additives and/or surfactant) are mixed in a solvent system to form the particular composition. Preferred solvent systems include a solvent selected from the group consisting of cyclopentanone, cyclohexanone or PGMEA, PGME, PGEE, ethyl lactate, GBL, and mixtures thereof. The solvent system is preferably utilized at a level of about 50% to about 98% by weight, more preferably about 60% to about 95% by weight, and even more preferably about 85% to about 95% by weight, based upon the total weight of the composition taken as 100% by weight. It will be appreciated that, when the reaction solvent is also a formulation solvent (e.g., PGME, PGMEA, or PGEE), no further isolation or precipitation may be necessary after synthesis. That is, there is no need to remove any solvent (which avoids the prior art need to remove NMP, for example) or to remove the polymer from the solvent. The composition can simply be further diluted with the desired solvent to reach a final solvent level of about 50% by weight to about 98% by weight, and preferably about 85% by weight to about 95% by weight, based on the total weight of the composition taken as 100% by weight, with the total solids ranges being the balance of the foregoing to take the composition to 100% by weight. The material is preferably filtered before use, such as with a 0.1-μm or 0.2-μm PTFE filter.

In one embodiment, the compositions consist essentially of, or even consist of, the polyimide and/or diimide dispersed or dissolved in a solvent system. In another embodiment, the compositions consist essentially of, or even consist of, the polyimide and/or diimide dispersed or dissolved in a solvent system, along with one, two, three, four, or all five of crosslinkers, surfactants, polymers, catalysts, and/or additives.

Methods of Using the Compositions

In more detail, the present invention provides a method of forming a microelectronic structure that is particularly suited for lithography. In the inventive method, a substrate having a surface is provided. Any microelectronic substrate can be utilized. The substrate is preferably a semiconductor substrate, such as silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, tetramethyl silate and tetramethylcyclotetrasiloxane combinations (such as that sold under the name CORAL), SiCOH (such as that sold under the name Black Diamond, by SVM, Santa Clara, CA, US), glass, or mixtures of the foregoing. Optional intermediate layers may be formed on the substrate prior to processing, with one especially preferred intermediate layer being TiN. The substrate can have a planar surface, or it can include topographic features (via holes, trenches, contact holes, raised features, lines, etc.). As used herein, "topography" refers to the height or depth of a structure in or on a substrate surface.

A layer of the inventive SOC composition is formed on the substrate or any intermediate layers. The SOC layer can be formed by any known application method, with one preferred method being spin-coating at speeds of about 1,000 rpm to about 2,000 rpm, and preferably about 1,200 rpm to about 1,500 rpm, for a time period of from about 30 seconds to about 90 seconds, and preferably about 45 seconds to 60 seconds. Preferably, the inventive composition has good spin bowl compatibility, that is, it will not react or form a precipitate with common photoresist solvents such as PGME, PGMEA, ethyl lactate, cyclohexanone, or combinations thereof.

After the carbon-rich composition is applied, it is preferably heated to a temperature of about 100° C. to about 250° C., and more preferably about 170° C. to about 230° C., for about 30 seconds to about 90 seconds, and preferably about 45 seconds to about 60 seconds, to evaporate solvents. The SOC composition advantageously has fast thermal reflow. That is, at temperatures above about 200° C., the viscosity of the composition is less than about 10 cP, as determined by a rheometer.

The average thickness of the SOC or carbon-rich layer after baking is preferably about 50 nm to about 2.5 μm, more preferably about 80 nm to about 150 nm, and even more preferably about 100 nm to about 120 nm. The average thickness is determined by taking the average of thickness measurements at five different locations of the SOC layer, with those thickness measurements being obtained using ellipsometry.

After baking, the SOC layers formed preferably comprise greater than about 75% by weight carbon, more preferably greater than about 80% by weight carbon, and even more preferably about 85% to about 90% by weight carbon, based upon the baked layer taken as 100% by weight. The SOC layer preferably has high temperature stability, with little to no thermal decomposition below about 500° C. For example, the SOC layers described herein exhibits less than about 10% weight loss when heated to about 400° C. for about 10 minutes and, even more preferably, less than about 10% weight loss when heated to about 500° C. for about 10 minutes, as measured using thermogravimetric analysis.

Additionally, the SOC layers comprise the majority of any additives that were included in the SOC composition from which the layer was formed. That is, the baked SOC layer will retain at least about 50% by weight, preferably at least about 80% by weight, more preferably at least about 90% by weight, and even more preferably at least about 95% by weight of the starting additive quantity.

In one embodiment, the final SOC layers will comprise about 0.25% by weight to about 9.5% by weight, preferably about 0.4% to about 8% by weight, more preferably about 0.6% to about 5% by weight, and even more preferably about 0.8% to about 2.5% of one or more of the previously described additives, based upon the total weight of the layer taken as 100% by weight. Alternatively or additionally, the total weight of the combination of all additives present in the final layer preferably falls into the foregoing ranges.

The SOC layer preferably has little or no shrinkage. That is, the average thickness decreases by less than about 5% after being heated to about 400° C. for about 10 minutes and, even more preferably, the thickness decreases less than about 5% after being heated to about 500° C. for about ten minutes. In some cases, the shrinkage of the SOC layer may be negative, meaning the thickness of the layer increases after the described baking conditions, indicating swelling of the SOC layer. (In these cases, it is theorized that the SOC layer may become less dense after high-temperature bakes, leading to a small weight loss, but slight film swelling.) In one embodiment, the SOC layer has good SC1 resistance, in that it is not affected by exposure in an SC1 cleaning solution for more than about 30 minutes at about 60° C.

A hardmask layer may be applied adjacent to the SOC layer or to any intermediate layers that might be present on the SOC layer. The hardmask layer can be formed by any known application method, such as chemical vapor deposition ("CVD") or plasma-enhanced chemical vapor deposition ("PECVD"). Another preferred method comprises spin-coating at speeds of about 1,000 rpm to about 5,000 rpm, and preferably about 1,250 rpm to about 1,750 rpm, for a time period of about 30 seconds to about 120 seconds, and preferably about 45 seconds to about 75 seconds. Suitable hardmask layers should have a high etch bias relative to underlying layers. Preferred hardmask layers have high-silicon-content materials, preferably at least about 30% by weight, and more preferably from about 35% by weight to about 40% by weight silicon, based on the total weight of the hardmask layer. Suitable hardmask layers are commercially available and can be formed from a composition comprising a polymer or oligomer (e.g., silanes, siloxanes, silsesquioxanes, silicon oxynitride, silicon nitride, polysilicon, amorphous silicon, and combinations thereof) dissolved or dispersed in a solvent system. Some preferred monomers or polymers for use in the hardmask layer are selected from the group containing phenethyltrimethoxysilane ("PETMS"), 2-(carbomethoxy)ethyltrimethoxysilane ("CMETMS"), tetraethoxysilane ("TEOS"), methyltrimethoxysilane, phenyltrimethoxysilane, methyltrimethoxysilane ("MTMS"), ethyltrimethoxysilane ("ETMS"), (3-glycidyoxypropyl) triethoxysilane, 2-(3,4-epoxycyclohexyl) ethyltrimethyoxysilane ("ECHTMS"), and mixtures thereof. Any optional ingredients (e.g., surfactants, acid catalysts, base catalysts, and/or crosslinkers) are dissolved in the solvent system along with the polymer, monomer, and/or oligomer. Preferred hardmask compositions will preferably have solids content of about 0.1% to about 70%, more preferably about 0.5% to about 10%, and even more preferably about 0.5% to about 1% by weight, based upon the total weight of the composition taken as 100% by weight.

After the hardmask composition is applied, it is preferably heated to a temperature of about 100° C. to about 300° C., and more preferably about 150° C. to about 250° C., and for a time period of about 30 seconds to about 120 seconds, and preferably about 45 seconds to about 60 seconds, to evaporate solvents. The average thickness (measured by ellipsometry over five locations and averaged) of the hardmask layer after baking is preferably about 5 nm to about 50,000 nm, more preferably about 5 nm to about 1000 nm, and even more preferably about 10 nm to about 30 nm.

Advantageously, the inventive SOC layers can survive harsh CVD processes, such as those used to apply the above-described hardmask layer on top of the SOC layer. To determine whether an SOC layer will survive typical CVD semiconductor manufacturing processes, a "CVD survivability test" is performed by coating a topography chip (preferably a chip having variety of topography features, including but not limited to 50-nm line/space, relaxed pitch features, large features, 50-μms line with large spaces of ~50 μm, and/or contact holes/via with either 100-nm-or 200-nm-deep features) with the SOC composition to be tested followed by baking at about 170° C. for about 1 minute on a hotplate and then at about 450° C. for about 4 minutes in a furnace in $N_2$ atmosphere to form a cured SOC layer having an average thickness of about 180 nm. Next, the coated chips are deposited with a SiOx or SiNx test film using PECVD at about 400° C. in high vacuum. After PECVD deposition, the chips are inspected with an optical microscope. Failure or passing is determined based on the number defects (bubbles, delaminations, wrinkles, and/or cracks) experienced by the CVD-deposited film. A film that successfully passes the CVD survivability test has fewer than about 0.1 defects/cm$^2$ of CVD film (i.e., fewer than about 15 defects per 8-inch wafer), preferably fewer than about 0.05 defects/cm$^2$ of CVD film (i.e., fewer than about 7.5 defects per 8-inch wafer), and more preferably about 0 defects/cm$^2$ of CVD film, when observed under an optical microscope. Examples of failed and passed CVD survivability tests are shown in FIG. 1. SOC or carbon-rich compositions or layers that perform within these parameters for at least one of SiOx or SiNx test films are considered to possess the property of CVD survivability. In particularly preferred embodiments, the SOC layer possesses CVD survivability when subjected to this test with a SiOx test film and also when subjected to this test with a SiNx test film.

Next, a photoresist (i.e., imaging layer) can be applied to the SOC or any intermediate layers to form a photoresist layer. The photoresist layer can be formed by any conventional method, with one preferred method being spin coating the photoresist composition at speeds of about 350 rpm to about 4,000 rpm (preferably about 1,000 rpm to about 2,500 rpm) for a time period of about 10 seconds to about 60 seconds (preferably about 10 seconds to about 30 seconds). The photoresist layer is then optionally post-application baked ("PAB") at a temperature of at least about 70° C., preferably about 80° C. to about 150° C., and more preferably about 100° C. to about 150° C., for time periods of about 30 seconds to about 120 seconds. The average thickness (determined as described previously) of the photoresist layer after baking will typically be about 5 nm to about 120 nm, preferably about 10 nm to about 50 nm, and more preferably about 20 nm to about 40 nm.

The photoresist layer is subsequently patterned by exposure to radiation for a dose of about 10 mJ/cm$^2$ to about 200 mJ/cm$^2$, preferably about 15 mJ/cm$^2$ to about 100 mJ/cm$^2$, and more preferably about 20 mJ/cm$^2$ to about 50 mJ/cm$^2$. More specifically, the photoresist layer is exposed using a mask positioned above the surface of the photoresist layer. The mask has areas designed to permit the radiation to reflect from or pass through the mask and contact the surface of the photoresist layer. The remaining portions of the mask are designed to absorb the light to prevent the radiation from contacting the surface of the photoresist layer in certain areas. Those skilled in the art will readily understand that the arrangement of reflecting and absorbing portions is designed based upon the desired pattern to be formed in the photoresist layer and ultimately in the substrate or any intermediate layers.

After exposure, the photoresist layer is subjected to a post-exposure bake ("PEB") at a temperature of less than about 180° C., preferably about 60° C. to about 140° C., and more preferably about 80° C. to about 130° C., for a time period of about 30 seconds to about 120 seconds (preferably about 30 seconds to about 90 seconds).

The photoresist layer is then contacted with a developer to form the pattern. Depending upon whether the photoresist used is positive-working or negative-working, the developer will either remove the exposed portions of the photoresist layer or remove the unexposed portions of the photoresist layer to form the pattern. The pattern is then transferred through the various layers, and finally to the substrate. This pattern transfer can take place via plasma etching (e.g., $CF_4$ etchant, $O_2$ etchant) or a wet etching or developing process.

In one embodiment, once the inventive layer has been patterned, an SC1 etch can be used to open the metal layer (e.g., TiN) used as another hardmask to transfer the pattern further into the substrate. The inventive SOC layer will experience little to no undercut, meaning it will protect the metal layer from dissolution where the SOC layer is present.

Figure 2:
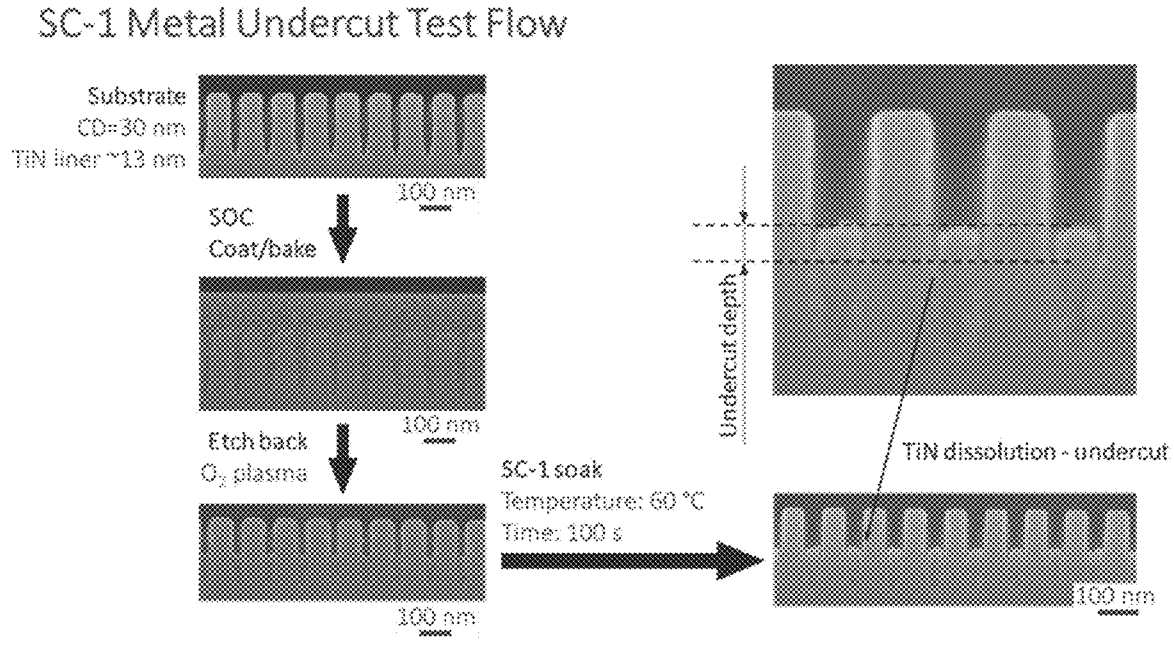
FIG. 2 shows the test flow of an exemplary SC1 resistance testing procedure.

"SC1 resistance testing" is performed by spin-coating a 180-nm thick coating of the carbon-rich composition on top of a TiN liner topography substrate followed by baking it at about 170° C. for about 1 minute on a hotplate and at about 450° C. for about 4 minutes in a furnace in an $N_2$ atmosphere. The layer is then etched back with 02 plasma to partially remove the material to mid-trench depth, and the substrate is immersed in an SC1 etchant bath at about 60° C. for about 100 seconds. An SEM (200kx) cross-section analysis is performed to determine the undercut depth. FIG. 2 shows the flow for the SC1 testing, and the method of measuring the undercut depth. The wafer in FIG. 2 was an SC1 wafer with an ALD layer of TiN with 50-nm line/space and 200-nm deep features. Preferably, the undercut depth is less than about 60 nm, more preferably less than about 30 nm, and even more preferably from about 0.1 nm to about 20 nm. SOC or carbon-rich compositions or layers that perform within these parameters are considered to possess the property of being SC1 resistant.

Additional advantages of the various embodiments will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present disclosure encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the disclosure. It is to be understood, however, that these examples are provided by way of illustration, and nothing therein should be taken as a limitation upon the overall scope.

Example 1

1. Polyamic Acid Synthesis

In this Example, 12.866 grams of 9,9-bis(4-aminophenyl) fluorene ("FDA," JFE, Japan) were dissolved in 115.741 grams of N-methyl-2-pyrrolidone ("NMP," Sigma Aldrich, St Louis, MO) in a 500-ml round-bottom flask. 7.144 grams of benzophenone-3,3'4,4'-tetracarboxylic dianhydride ("BTDA," Sigma Aldrich, St Louis, MO) were dissolved in 64.081 grams of NMP, and the solution was added to an addition funnel, which was connected to the round-bottom flask. The system was purged with nitrogen for 10 minutes. Then, the BTDA solution was added dropwise to the FDA solution and stirred magnetically under nitrogen over a period of 20 minutes. The reaction was allowed to proceed at room temperature under nitrogen with magnetic stirring for 32 hours.

2. Endcapping of Polyamic Acid

To the polyamic acid solution obtained in Part 1 above, a solution of 3.443 grams of phthalic anhydride ("PTA," Sigma Aldrich, St Louis, MO) in 31.033 grams of NMP was added under nitrogen with magnetic stirring. The reaction was allowed to proceed at room temperature under nitrogen with magnetic stirring for 21 hours.

3. Solution Imidization of Polyamic Acid

To the endcapped polyamic solution obtained in Part 2, 50 grams of toluene (Sigma Aldrich, St Louis, MO) were added. A Dean-Stark collector was connected to the reaction flask. The oil bath in which the flask was immersed was heated to 180° C. Azeotropic distillation of water-toluene began when the imidization started between 150° C. and 160° C. The reaction was allowed to proceed at these temperatures under nitrogen with magnetic stirring for 8 hours, after which the system was cooled to room temperature.

Example 2

1. Purification of Polyimide

In this procedure, 20 grams of the polyimide solution obtained in Example 1 were precipitated in 100 grams of acetone (Sigma Aldrich, St Louis, MO). The precipitated polyimide was filtered and washed with acetone and was then air-dried. GPC with a polystyrene standard showed a single peak with Mw=8637, Mn=6229, and PDI=1.39.

2. Coating Formulation

Next, 0.536 gram of the polymer solid obtained in Part 1 was dissolved in 9.536 grams of cyclopentanone (Sigma Aldrich, St Louis, MO). The solution was filtered through a 0.1-μm PTFE membrane filter (General Electric, UK).

Example 3

Planarization Test

Figure 3:
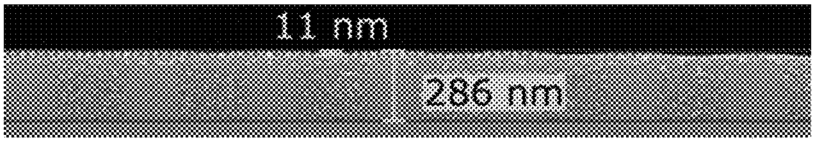
FIG. 3 is a scanning electron microscope ("SEM") image (200kx) of a chip coated as described in Example 3, using the Example 2 formulation.
Figure 4:
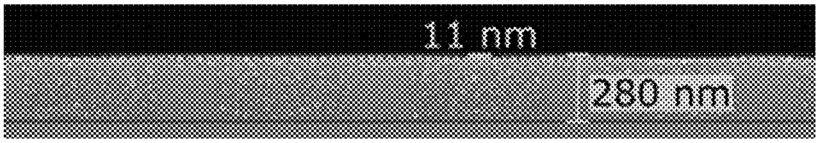
FIG. 4 is an SEM image (200kx) of a chip coated as described in Example 3, using the Example 2 formulation.
Figure 5:
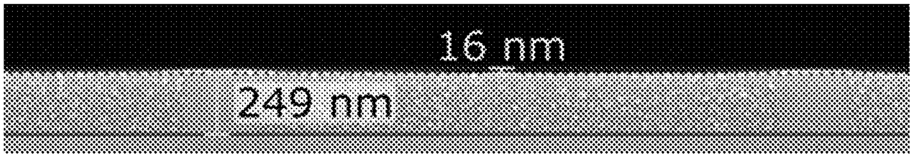
FIG. 5 is an SEM image (200kx) of a chip coated as described in Example 3, using the Example 2 formulation.

The solution prepared in Example 2 was spin coated at 1,500 rpm for 60 seconds on chips containing lines of different densities (220-nm CD with a 1:1, 1:2, or 1:5 line/space ratio and 100-nm high features). The chips were baked at 170° C. for 1 minute on a hotplate and at 450° C. for 4 minutes in a furnace. The chips were examined by SEM. The results indicated that the lines were well planarized (See FIG. 3 (1:1 line/space), 4 (1:2 line/space) and 5 (1:5 line/space)).

Example 4

1. Polyamic Acid Synthesis

In this Example, 6.33 grams of FDA were dissolved in 56.11 grams of NMP in a 500-ml round-bottom flask. 4.996 grams of 9,9-bis(3,4-dicarboxyphenyl)fluorene dianhydride (FDAH, JFE, Japan) was dissolved in 45.367 grams of NMP, and the solution was added to an addition funnel, which was connected to the round-bottom flask. The system was purged with nitrogen for 10 minutes. Then the FDAH solution was added dropwise to the FDA solution and stirred magnetically under nitrogen over a period of 17 minutes. The reaction was allowed to proceed at room temperature under nitrogen with magnetic stirring for 19 hours.

2. Endcapping of Polyamic Acid

To the obtained polyamic acid solution from Part 1, 2.19 grams of acetic anhydride (Sigma Aldrich, St Louis, MO) were added under nitrogen with magnetic stirring. The reaction was allowed to proceed at room temperature under nitrogen with magnetic stirring for 24 hours.

3. Solution Imidization of Polyamic Acid

To the endcapped polyamic solution, 27.40 grams of toluene were added. A Dean-Stark collector was connected to the reaction flask. The oil bath in which the flask was immersed was heated to 180° C. Azeotropic distillation of water-toluene began when the imidization started between 150° C. and 160° C. The reaction was allowed to proceed at these temperatures under nitrogen with magnetic stirring for 8 hours. Then the system was cooled down to room temperature.

4. Purification of Polyimide

Next, 100 grams of the polyimide solution obtained in Part 3 was precipitated in 500 grams of acetone/methanol (50:50) mixture (Sigma Aldrich, St Louis, MO). The precipitated polyimide was filtered and washed with acetone/methanol (50:50), after which it was air-dried. GPC showed a single peak with Mw=3772, Mn=3145 and PDI=1.20.

5. Coating Formulation

To prepare a coating formation, 1.021 grams of the polymer solid obtained in Part 5 was dissolved in 15.585 grams of cyclopentanone. 0.104 gram of 1% R30N surfactant (DIC Corporation, Japan) was added. The solution was filtered through 0.1-μm PTFE membrane filter.

Example 5

Planarization Test

Figure 6:
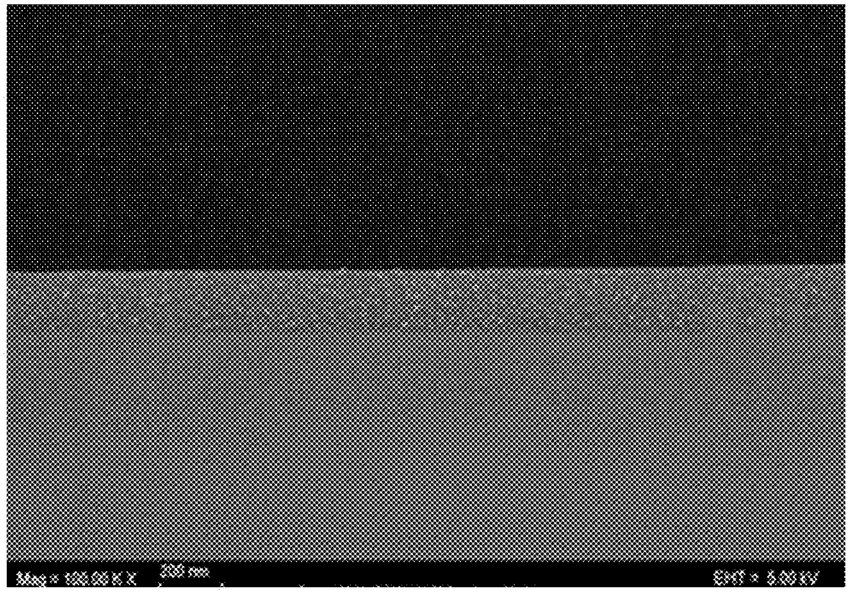
FIG. 6 is an SEM image of a chip coated as described in Example 5, using the Example 4 formulation.
Figure 7:
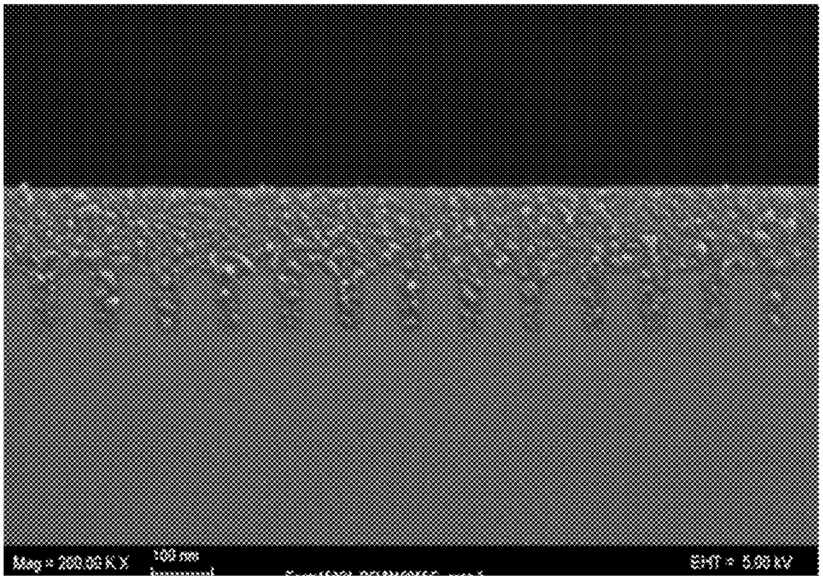
FIG. 7 is an SEM image of a chip coated as described in Example 5, using the Example 4 formulation.
Figure 8:
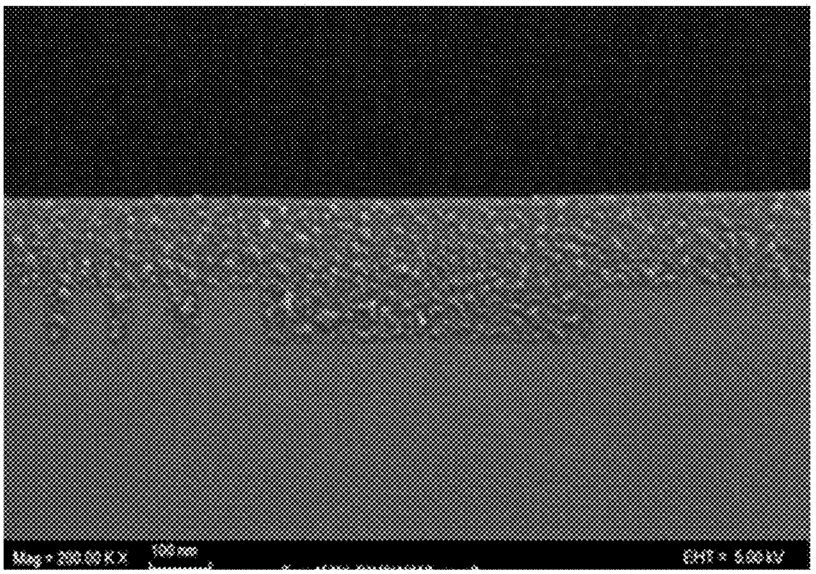
FIG. 8 is an SEM image of a chip coated as described in Example 5, using the Example 4 formulation.

The solution prepared in Example 4 was spin coated at 1,500 rpm for 60 seconds on chips containing lines of different densities. The chips were baked at 170° C. for 1 minute on a hotplate and at 450° C. for 4 minutes in a furnace. The chips were examined by SEM. The results showed a good planarization, as seen in FIGS. 6-8. The FIG. 6 chip had 50-nm lines with 250-nm spaces on the left, a 1.5-micron gap, and then 50-nm lines with 50-nm spaces. FIG. 7 is a more intensely magnified view of the 1:1 area, and FIG. 8 is a 1:1 area on the left and a 50-μm oxide pad on the right with a 500-nm trench in between dense and pad.

Example 6

1. Polyamic Acid Synthesis

In this Example, 9.507 grams of FDA were dissolved in 60.25 grams of NMP in a 500-ml round-bottom flask. 5.002 grams of FDAH were dissolved in 99.50 grams of NMP, and the solution was added to an addition funnel, which was connected to the round-bottom flask. The system was purged with nitrogen for 10 minutes. Then the FDAH solution was added dropwise to FDA solution and stirred magnetically under nitrogen over a period of 20 minutes. The reaction was allowed to proceed at room temperature under nitrogen with magnetic stirring for 24 hours.

2. Endcapping of Polyamic Acid

To the polyamic acid solution prepared in Part 1 above, 8.136 grams of 4-phenylethynyl phthalic anhydride ("PEPA," TCI America, Portland, OR) were added under nitrogen with magnetic stirring. The reaction was allowed to proceed at room temperature under nitrogen with magnetic stirring for 28 hours.

3. Solution Imidization of Polyamic Acid

To the endcapped polyamic solution obtained in Part 1 above, 40.36 grams of toluene were added. A Dean-Stark collector was connected to the reaction flask. The oil bath in which the flask was immersed was heated to 180° C. Azeotropic distillation of water-toluene began when the imidization started between 150° C. and 160° C. The reaction was allowed to proceed at these temperatures under nitrogen with magnetic stirring for 8 hours, after which the system was cooled to room temperature.

4. Purification of Polyimide

Next, 100 grams of the polyimide solution obtained in Part 3 above were precipitated in 500 grams of methanol. The precipitated polyimide was filtered and washed with methanol and was then air-dried. GPC analysis showed a Mw=2567, Mn=1716 and PDI=1.49.

5. Coating Formulation

A coating formulation was prepared by dissolving 5.014 grams of the polymer solid obtained in Part 4 in 134.445 grams of cyclopentanone. Next, 7.508 grams of 2% NF7177C (to improve adhesion; Mitsubishi Gas Company, Japan) and 0.501 gram of 1% R30N surfactant were added. The solution was filtered through 0.1-μm PTFE membrane filter.

Example 7

Planarization Test

Figure 9:
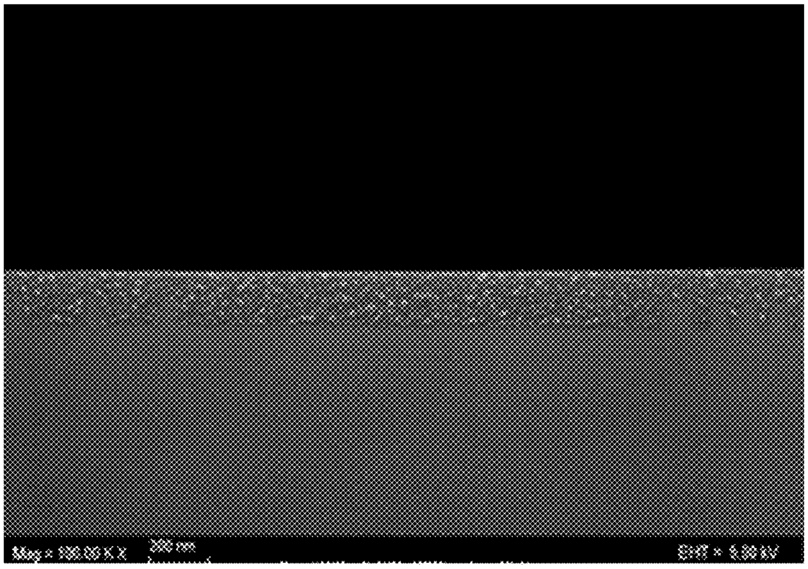
FIG. 9 is an SEM image of a chip coated as described in Example 7, using the Example 6 formulation.
Figure 10:
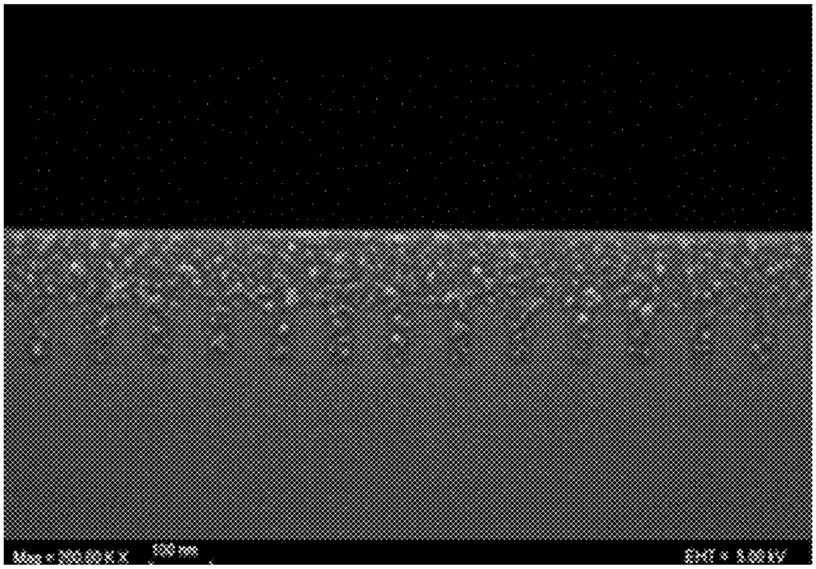
FIG. 10 is an SEM image of a chip coated as described in Example 7, using the Example 6 formulation.
Figure 11:
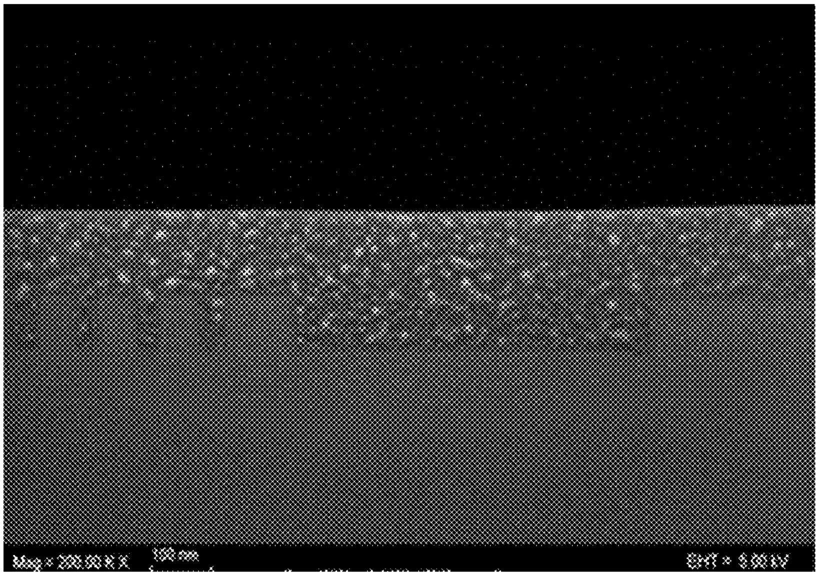
FIG. 11 is an SEM image of a chip coated as described in Example 7, using the Example 6 formulation.

The solution from Example 6 was spin coated at 1,500 rpm for 60 seconds on chips containing lines of different densities. The chips were baked at 170° C. for 1 minute on a hotplate and at 450° C. for 4 minutes in a furnace. The chips were examined by SEM. The results showed a good planarization as shown in FIGS. 9-11. The FIG. 9 chip had 50-nm lines with 250-nm spaces on the left, a 1.5-micron gap, and then 50-nm lines with 50-nm spaces. FIG. 10 is a more intensely magnified view of the 1:1 area, and FIG. 11 is a 1:1 area on the left and 50-μm oxide pad on the right with a 500-nm trench in between dense and pad.

Example 8

1. Diamic Acid Synthesis in NMP

In this Example, 9.169 grams of FDAH were added to a 500-ml round-bottom flask. Next, 4.747 grams of 3-ethynylaniline (3-EA, TCI America, Portland, OR) were dissolved in 155.00 grams of NMP, and the solution was added to an addition funnel, which was connected to the round-bottom flask. The system was purged with nitrogen for 10 minutes. The 3-EA solution was then added dropwise to the flask and stirred magnetically under nitrogen over a period of 5 minutes. The reaction was allowed to proceed at room temperature under nitrogen with magnetic stirring for 24 hours.

2. Solution Imidization of Diamic Acid

Next, 166 grams of toluene were added to the solution obtained in Part 1. A Dean-Stark collector was connected to the reaction flask. The oil bath in which the flask was immersed was heated to 180° C. Azeotropic distillation of water-toluene began when the imidization started between 150° C. and 160° C. The reaction was allowed to proceed at these temperatures under nitrogen with magnetic stirring for 8 hours, after which the system was cooled to room temperature.

3. Purification of Diimide

The diimide solution was rotavaped to remove toluene. It was then precipitated in DI water (1:10 weight ratio). The precipitated diimide was filtered and washed with DI water. It was dried under nitrogen flow. GPC analysis using NMP as the mobile phase showed a Mw=1168, Mn=973 and PDI=1.20.

4. Coating Formulation

A coating formulation was prepared by dissolving 1.672 grams of the diimide solid obtained in Part 3 above in 22.237 grams of cyclopentanone. Next, 2.516 grams of 2% NF7177C and 1.675 grams of 0.1% R30N surfactant were added. The solution was filtered through 0.1-μm PTFE membrane filter.

Example 9

Planarization Test

Figure 12:
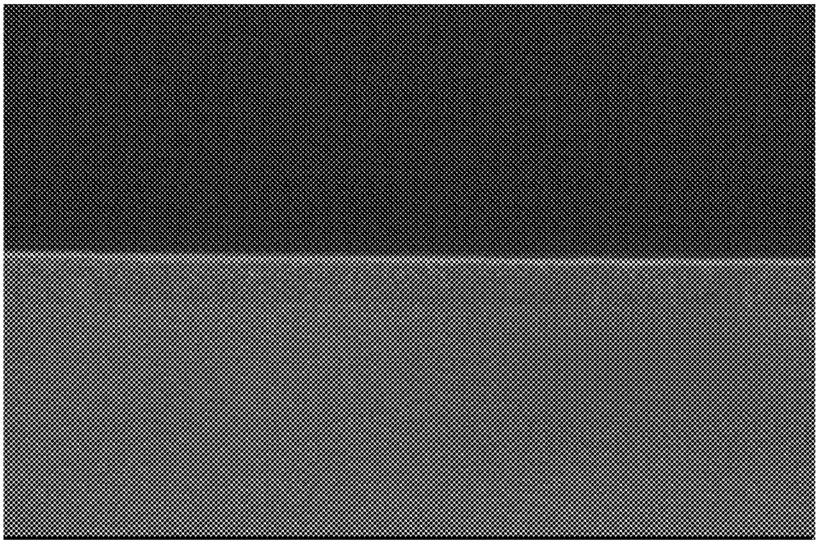
FIG. 12 is an SEM image (100kx) of a chip coated as described in Example 9, using the Example 8 formulation.
Figure 13:
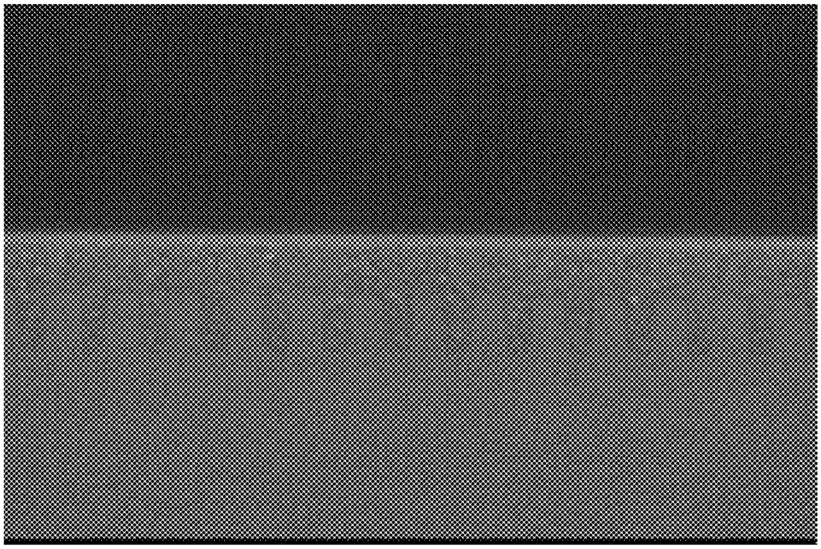
FIG. 13 is an SEM image (200kx) of a chip coated as described in Example 9, using the Example 8 formulation.
Figure 14:
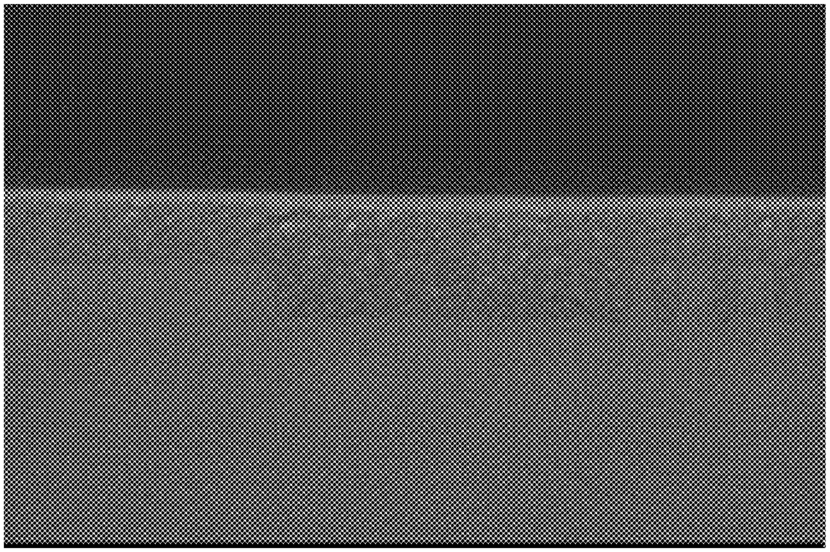
FIG. 14 is an SEM image (200kx) of a chip coated as described in Example 9, using the Example 8 formulation.
Figure 15:
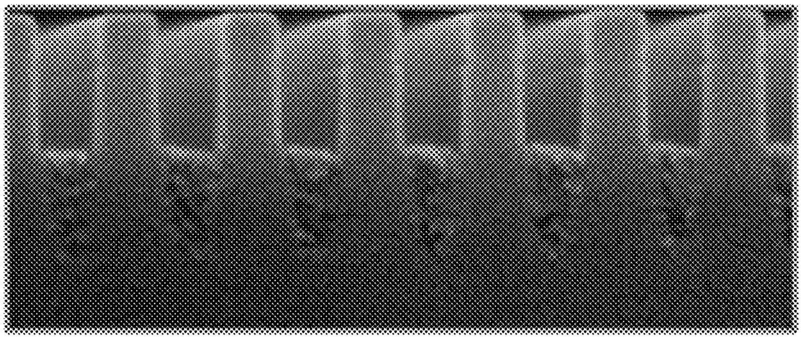
FIG. 15 is an SEM image (200kx) of a chip coated as described in Example 23, using the Example 20 formulation.
Figure 16:
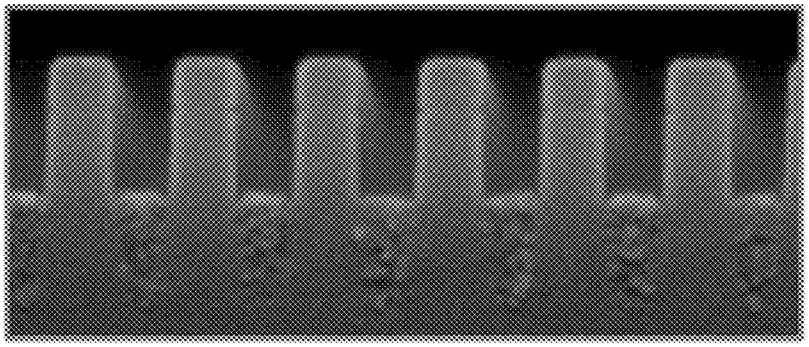
FIG. 16 is an SEM image (200kx) of a chip coated as described in Example 23, using the Example 21 formulation.
Figure 17:
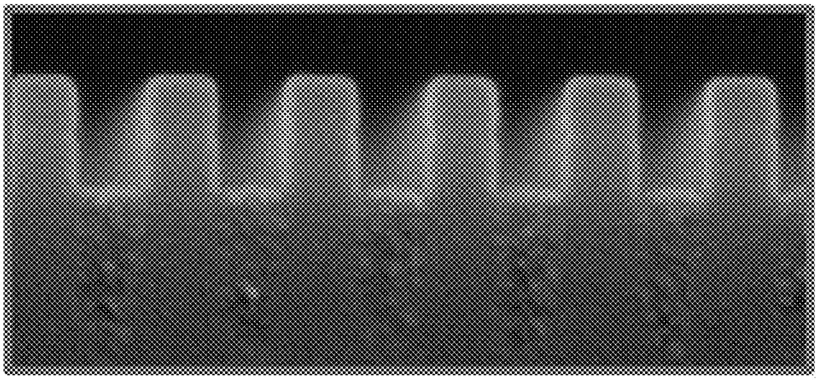
FIG. 17 is an SEM image (200kx) of a chip coated as described in Example, 23, using the Example 22 formulation.
Figure 18:
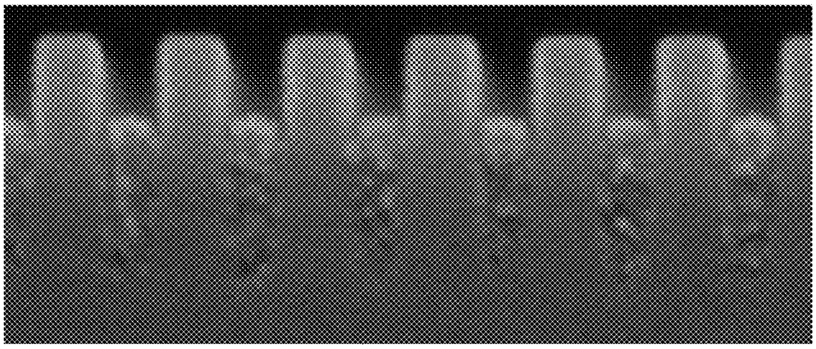
FIG. 18 is an SEM image (200kx) of a chip coated as described in Example 23, using the Example 12 formulation.
Figure 19:
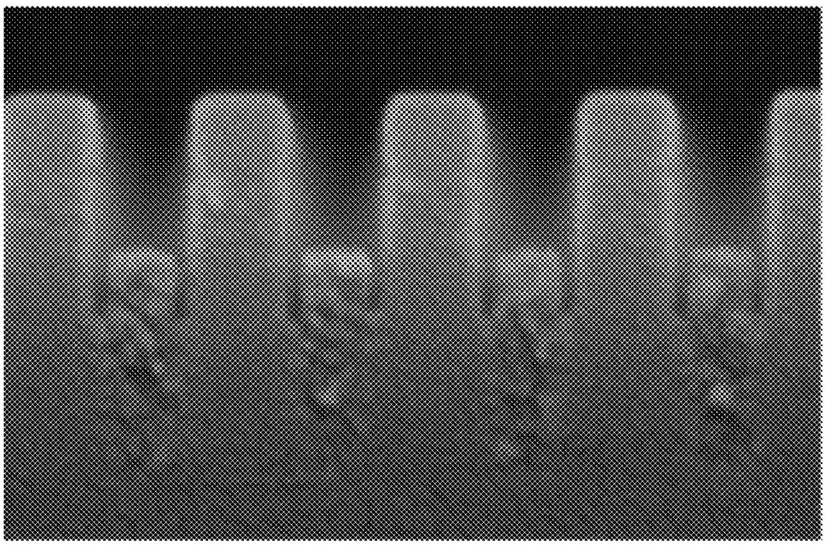
FIG. 19 is an SEM image (200kx) of a chip coated as described in Example 28, using a control formulation.
Figure 20:
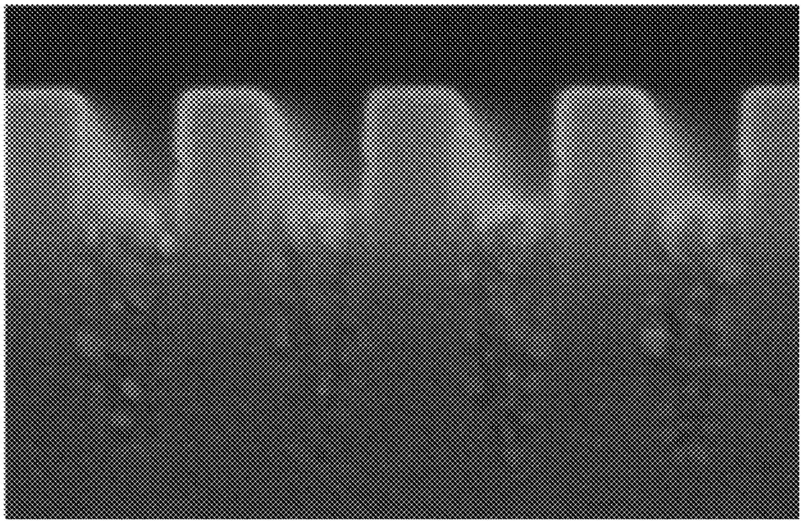
FIG. 20 is an SEM image (200kx) of a chip coated as described in Example 28, using the Example 24 formulation.
Figure 21:
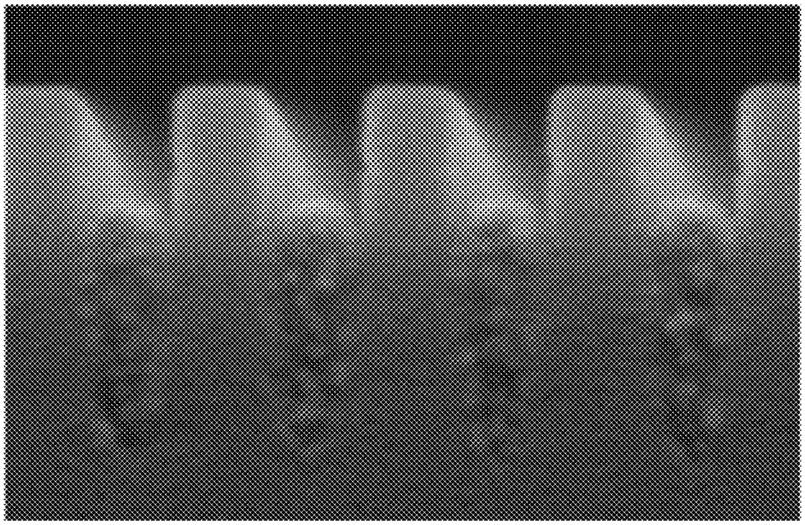
FIG. 21 is an SEM image (200kx) of a chip coated as described in Example 28, using the Example 25 formulation.
Figure 22:
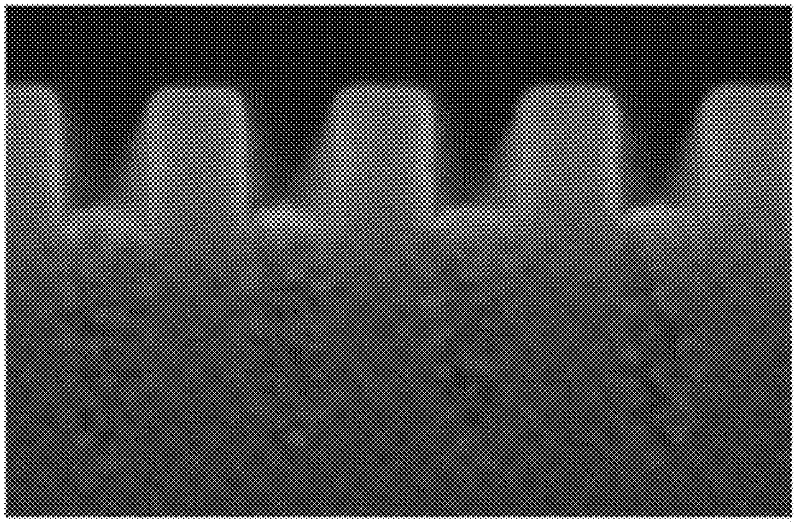
FIG. 22 is an SEM image (200kx) of a chip coated as described in Example 28, using the Example 26 formulation.
Figure 23:
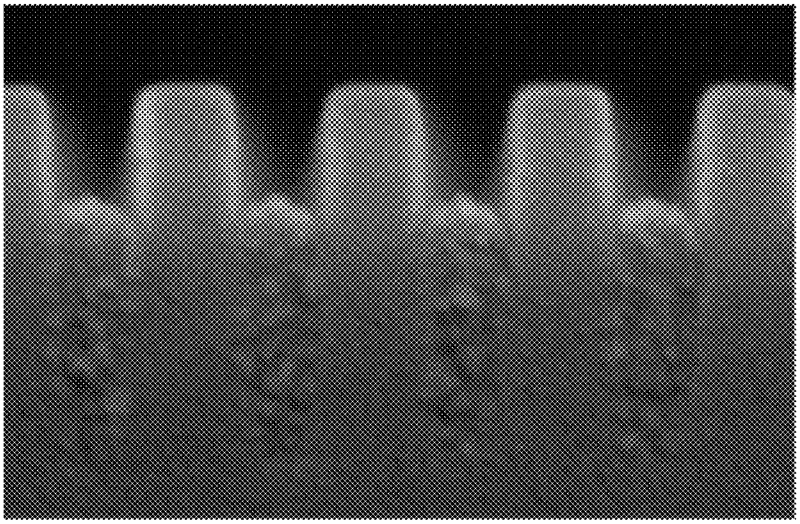
FIG. 23 is an SEM image (200kx) of a chip coated as described in Example 28, using the Example 27 formulation.

The solution prepared in Example 8 was spin coated at 1,500 rpm for 60 seconds on chips containing lines of different densities. The chips were baked at 170° C. for 1 minute on a hotplate and at 450° C. for 4 minutes in a furnace. The chips were examined by SEM. The results showed a good planarization as shown in FIGS. 12-14. The FIG. 12 chip had 50-nm lines with 50-nm spaces on the left, a 1.5-micron gap, and then 50-nm lines with 250-nm spaces. FIG. 13 is a more intensely magnified view of the 1:1 area, and FIG. 14 is a 50-μm oxide block on the left and a 1:1 area on the right with a 500-nm trench in between.

Example 10

1. Diimide Synthesis in PGMEA

In this Example, 27.18 grams of FDAH were added to a 500-m1 round-bottom flask. Next, 13.94 grams of 3-EA were dissolved in 163.56 grams of PGMEA (General Chemical Corporation, USA), and the solution was added to an addition funnel, which was connected to the round-bottom flask. The system was purged with nitrogen for 10 minutes. Then the 3-EA solution was added dropwise to the flask and stirred magnetically under nitrogen over a period of 4 minutes. The reaction was allowed to proceed at room temperature under nitrogen with magnetic stirring for 4 hours, after which the flask was connected to a condenser, and the reaction temperature was raised to 150° C. The imidization reaction was allowed to proceed at 150° C. under nitrogen with magnetic stirring for 8 hours.

2. Purification of Diimide

The diimide solution obtained in Part 1 above was precipitated in hexanes (1:5 weight ratio, Sigma Aldrich, St Louis, MO). The precipitated diimide was filtered and washed with hexanes (Tedia High Purity Solvents, Fairfield, OH) and then dried in a vacuum oven at 70° C. overnight.

Example 11

1. Diimide Synthesis in PGME

In this Example, 26.43 grams of FDAH were added to a 500-m1 round-bottom flask. Next, 13.57 grams of 3-EA were dissolved in 60 grams of PGME (General Chemical Corporation, USA), and the solution was added to an addition funnel, which was connected to the round-bottom flask. The system was purged with nitrogen for 10 minutes, after which the 3-EA solution was added dropwise to the flask and stirred magnetically under nitrogen over a period of 4 minutes. The reaction was allowed to proceed at 50° C. under nitrogen with magnetic stirring for 8 hours. The flask was then connected to a condenser, and the reaction temperature was raised to 130° C. The imidization reaction was allowed to proceed at 150° C. under nitrogen with magnetic stirring for 16 hours.

2. Purification of Diimide

The diimide solution obtained in Part 1 above was precipitated in hexanes (1:5 weight ratio, Sigma Aldrich, St Louis, MO). The precipitated diimide was filtered and washed with hexanes (Tedia High Purity Solvents, Fairfield, OH) and then dried in a vacuum oven at 70° C. overnight.

Example 12

Coating Formulation

A coating formulation was prepared by dissolving 3.88 grams of the diimide solid obtained in Example 10 in 81.7 grams of PGMEA and 4.8 grams of PGME. Next, 5.82 grams of 2% NF7177C and 3.8 grams of 0.1% R30N surfactant were added. The solution was filtered through 0.1-μm PTFE membrane filter.

Example 13

Coating Test

The coating formulation prepared in Example 12 was spin coated at 1,500 rpm for 60 seconds on silicon wafers. The wafers were baked at 170° C. for 1 minute on a hotplate and at 450° C. for 4 minutes in a furnace. After baking at 170° C. for one minute, the thickness of the coating was 114.6 nm. After baking at 450° C. for four minutes, the thickness of the coating was 112.9 nm, a loss of less than 5% of total thickness.

Example 14

Coating Formulation

In this Example, 5.03 grams of diimide solid obtained in Example 10 was dissolved in 85.45 grams of PGMEA and 4.6 grams of PGME. Next, 0.146 gram of gallic acid and 4.8 grams of 0.1% R30N surfactant were added. The solution was filtered through 0.1-μm PTFE membrane filter.

Example 15

Coating Test

The coating formulation from Example 14 was spin coated at 1,500 rpm for 60 seconds on silicon wafers. The wafers were baked at 170° C. for 1 minute on a hotplate and at 450° C. for 4 minutes in a furnace. After baking at 170° C. for one minute, the thickness of the coating was 99.8 nm. After baking at 450° C. for four minutes, the thickness of the coating was 101.4 nm, indicating no thickness loss, but potentially some slight swelling of the coating.

Example 16

Coating Formulation

In this Example, 5.00 gram of diimide solid obtained in Example 10 was dissolved in 85.25 grams of PGMEA and 4.75 grams of PGME. Next, 5.0 grams of 0.1% R30N surfactant were added. The solution was filtered through 0.1-μm PTFE membrane filter.

Example 17

Coating Test

The solution from Example 16 was spin coated at 1,500 rpm for 60 seconds on silicon wafers. The wafers were baked at 170° C. for 1 minute on a hotplate and at 450° C. for 4 minutes in a furnace. After baking at 170° C. for one minute, the thickness of the coating was 119.5 nm. After baking at 450° C. for four minutes, the thickness of the coating was 122.7 nm, indicating no thickness loss, but potentially some slight swelling of the coating.

Example 18

1. Synthesis of Diimide with FDA and EPA

In a 200-mL round-bottom flask, 3.48 grams of FDA and 3.44 grams of 4-ethynyl phthalic anhydride ("EPA," Nexamid 200, Nexam Chemical Holding AB, Lomma, Sweden) were added, followed by the addition of 27.68 grams of PGMEA. The flask was then connected to a condenser, and nitrogen was purged through the system. The flask was then placed in an oil bath at 150° C. and allowed to run for 80 minutes. Once reaction was complete, the flask was removed from oil bath and cooled to room temperature. The resulting solution was precipitated into ~0.5 liter hexane, and the solids were filtered off. The obtained polymer solids were dried at 40° C. under vacuum overnight.

2. Coating Formulation

In this Example, 0.5988 gram of the final dried solids, 14.28 grams of cyclopentanone, and 0.12 gram of FS3100 (1% solution in cyclopentanone) surfactant (The Chemours Company FC, LLC., USA) were stirred until dissolved. The solution was filtered through a 0.1-µm end-point filter and bottled for further use.

Example 19

Coating Test

The coating formulation prepared in Example 18 was spin coated at 1,500 rpm for 60 seconds on 100-mm silicon wafers. The wafers were baked at 170° C. for 1 minute on a hotplate and at 450° C. for 4 minutes in a furnace. After baking at 170° C. for one minute, the thickness of the coating was 157.3 nm. After baking at 450° C. for four minutes, the thickness of the coating was 163.0 nm, indicating no thickness loss, but potentially some slight swelling of the coating.

Example 20

Coating Formulation

In this Example, 4.72 grams of diimide solid obtained in Example 10 were dissolved in 90.3 grams of PGMEA and 4.8 grams of PGME. Next, 0.14 grams of NF7177C, 0.14 grams of gallic acid, and 4.7 grams of 0.1% R30N surfactant were added. The solution was filtered through 0.1-µm PTFE membrane filter.

Example 21

Coating Formulation

In this Example, 4.72 grams of diimide solid obtained in Example 10 were dissolved in 90.3 grams of PGMEA and 4.8 grams of PGME. Next, 0.14 grams of NF7177C, 0.14 grams of 2,3,4,3',4',5'-hexahydroxybenzophenone ("6-HBP"), and 4.7 grams of 0.1% R30N surfactant were added. The solution was filtered through 0.1-µm PTFE membrane filter.

Example 22

Coating Formulation

In this Example, 4.71 grams of diimide solid obtained in Example 10 were dissolved in 28.5 grams of PGMEA. Next, 68.5 grams of PGME. 0.14 grams of NF7177C, 0.14 grams of 3,3',5,5'-tetrakis(methoxymethyl)-[1,1'-biphenyl]-4,4'-diol ("TMOM-BP"), and 4.7 grams of 0.1% R30N surfactant were added. The solution was filtered through 0.1-µm PTFE membrane filter.

Example 23

SC1 Resistance Testing

The coating formulations from Examples 12, 20, 21, and 22, were spin coated at 1,500 rpm for 60 seconds on TiN liner chips containing narrow trenches (50-nm lines, 50-nm spaces, and 200-nm deep trenches in each instance). The chips were baked at 170° C. for 1 minute on a hotplate and at 450° C. for 4 minutes in a furnace, after which they were plasma etched to remove the coating in the open area and to partially remove the coating in the trenches. Next, the chips were immersed in SC1 etchant (ammonium hydroxide, hydrogen peroxide, and DI water in a 1:1:5 ratio) at 50° C. for 100 sec. After being air dried, the chips were examined by SEM. The results (FIGS. 15-18) showed that there was very little undercutting (i.e., less than 20 nm) on the chips coated with Example 20, 21, and 22 formulations, making those formulations particularly well-suited for use in processes incorporating SC1 etching.

Example 24

Coating Formulation

In this Example, 4.71 grams of diimide solid obtained in Example 10 were dissolved in 90.25 grams of PGMEA and 4.75 grams of PGME. Next, 0.14 grams of NF7177C, 0.14 grams of phenyl phosphate, and 0.1 gram of R30N surfactant were added. The solution mixed for 4 hours and was filtered through 0.2-µm PTFE filter.

Example 25

Coating Formulation

In this Example, 4.71 grams of diimide solid obtained in Example 10 were dissolved in 90.25 grams of PGMEA and 4.75 grams of PGME. Next, 0.14 grams of NF7177C, 0.14 grams of dimethyl phenyl phosphate, and 0.1 gram of R30N surfactant were added. The solution mixed for 4 hours and was filtered through 0.2-µm PTFE filter.

Example 26

Coating Formulation

In this Example, 4.71 grams of diimide solid obtained in Example 10 were dissolved in 90.25 grams of PGMEA and 4.75 grams of PGME. 0.14 grams of NF7177C, 0.14 grams of phenylbis(2,4,6-trimethylbenzoyl) phosphine oxide, and 0.1 gram of R30N surfactant were added. The solution mixed for 4 hours and was filtered through 0.2-µm PTFE filter.

Example 27

Coating Formulation

In this Example, 4.71 grams of diimide solid obtained in Example 10 were dissolved in 90.25 grams of PGMEA and 4.75 grams of PGME. Next, 0.14 grams of NF7177C, 0.14 grams of phenyl phosphonic acid, and 0.1 gram of R30N surfactant were added. The solution mixed for 4 hours and was filtered through 0.2-µm PTFE filter.

Example 28

SC1 Resistance Testing

The solutions from Examples 24-27 were spin coated on TiN liner chips containing narrow trenches (50-nm lines, 50-nm spaces, and 200-nm deep trenches in each instance) at 1,500 rpm for 60 seconds. The chips were baked at 170° C. for 1 minute on a hotplate and at 450° C. for 4 minutes in a furnace with $N_2$ flow, followed by plasma etching to remove the coating in the open area and to partially remove partially the coating in the trenches. Next, the chips were immersed in SC1 etchant (ammonium hydroxide, hydrogen peroxide, and DI water 1:1:5) at 60° C. for 100 seconds. After being air dried, the chips were examined by SEM. The results showed that there was significantly less undercut on the chips coated with solutions from Example 24-27 than those coated with a comparative solution without an additive (i.e., the comparative solution included 4.71 grams of diimide solid obtained in Example 10 dissolved in 90.25 grams of PGMEA and 4.75 grams of PGME). FIGS. 19-23 show the SEM cross sections of the coated substrates.

We claim:

1. A method of forming a microelectronic structure, said method comprising:

optionally forming one or more intermediate layers on a substrate surface, there being an uppermost intermediate layer on said substrate surface, if one or more intermediate layers are present;

applying a composition to said uppermost intermediate layer, if present, or to said substrate surface, if no intermediate layers are present, said composition comprising a diimide dissolved or dispersed in a solvent system, said diimide formed from a diamic acid formed from:

(i) a dianhydride and a crosslinkable monoamine; or (ii) a crosslinkable monoanhydride chosen from 4-cyclohexene-1,2-dicarboxylic anhydride, 5-norbornene-2,3-dicarboxylic anhydride, 4-methylethynyl phthalic anhydride, 4-phenylethynyl phthalic anhydride, or combinations thereof and a diamine, wherein when said diimide is formed from (ii), said composition further comprises a component chosen from polyphenols, polyhydroxy compounds, phosphoric compounds, or combinations of the foregoing; and heating said composition to form a carbon-rich layer, said carbon-rich layer having the property of presenting fewer than about 0.1 defects/$cm^2$ of layer surface area when subjected to a CVD survivability test, wherein the CVD survivability test used to determine when said property exists includes the steps of forming a SiOx or SiNx layer on the carbon-rich layer via plasma-enhanced chemical vapor deposition at about 400° C. under vacuum and observing the SiOx or SiNx layer for defects using an optical microscope at a magnification of 500×.

2. The method of claim 1, further comprising:

optionally forming one or more additional intermediate layers on said carbon-rich layer, there being an uppermost additional intermediate layer on said carbon-rich layer, if one or more additional intermediate layers are present;

applying an imaging layer to said one or more additional intermediate layers, if present, or to said carbon-rich layer, if no additional intermediate layers are present;

patterning said imaging layer to form a pattern therein;

transferring said pattern to said one or more additional intermediate layers on said carbon-rich layer, if present, and to said carbon-rich layer; and contacting said carbon-rich layer with SC1.

3. The method of claim 1, wherein said substrate surface comprises an intermediate layer, and said intermediate layer is chosen from TiN or $SiO_2$.

4. The method of claim 1, wherein said carbon-rich layer has the property of being SC1 resistant.

5. The method of claim 1, wherein when said diimide is formed from (i), said composition further comprises a component chosen from:

polyphenols;

polyhydroxy compounds;

phosphoric compounds; or combinations of the foregoing.

6. The method of claim 1, wherein said solvent system comprises propylene glycol monomethyl ether, and said applying said composition is carried out without removing some or all of said propylene glycol monomethyl ether prior to said applying.

7. The method of claim 1, wherein:

said dianhydride is chosen from benzophenone-3,3'4,4'-tetracarboxylic dianhydride, 4,4'-oxydiphthalic dianhydride, 9,9-bis(3,4-dicarboxyphenyl) fluorene dianhydride, or combinations thereof;

said crosslinkable monoamine is chosen from 2-vinylaniline, 4-vinylaniline, 2-allylaniline, 4-allylaniline, 3-ethynylaniline, 4-ethynylaniline, 2-ethynylaniline, or combinations thereof;

said crosslinkable monoanhydride is chosen from 4-methylethynyl phthalic anhydride, 4-phenylethynyl phthalic anhydride, or combinations thereof; and said diamine is chosen from 4,4'-oxydianiline, bis(4-aminophenyl) sulfone, 9,9-bis(4-aminophenyl) fluorene, or combinations thereof.

8. The method of claim 1, wherein said diamic acid is formed from a dianhydride and a crosslinkable monoamine.

9. The method of claim 8, wherein:

said dianhydride is chosen from benzophenone-3,3'4,4'-tetracarboxylic dianhydride, 4,4'-oxydiphthalic dianhydride, 9,9-bis(3,4-dicarboxyphenyl) fluorene dianhydride, or combinations thereof; and said crosslinkable monoamine is chosen from 2-vinylaniline, 4-vinylaniline, 2-allylaniline, 4-allylaniline, 3-ethynylaniline, 4-ethynylaniline, 2-ethynylaniline, or combinations thereof.

10. The method of claim 9, wherein said dianhydride is 9,9-bis(3,4-dicarboxyphenyl) fluorene dianhydride and said crosslinkable monoamine is chosen from 2-ethynylaniline, 3-ethynylaniline, 4-ethynylaniline, or combinations thereof.

11. The method of claim 1, said composition further comprising a second diimide different from said diimide.

12. A method of forming a microelectronic structure, said method comprising:

optionally forming one or more intermediate layers on a substrate surface, there being an uppermost intermediate layer on said substrate surface, if one or more intermediate layers are present;

applying a composition to said uppermost intermediate layer, if present, or to said substrate surface, if no intermediate layers are present, said composition comprising a diimide dissolved or dispersed in a solvent system, said diimide formed from a diamic acid formed from:

(i) a dianhydride and a crosslinkable monoamine; or (ii) a crosslinkable monoanhydride chosen from 4-cyclohexene-1,2-dicarboxylic anhydride, 5-norbornene-2,3-dicarboxylic anhydride, 4-methylethynyl phthalic anhydride, 4-phenylethynyl phthalic anhydride, or combinations thereof and a diamine, wherein when said diimide is formed from (ii), said composition further comprises a component chosen from polyphenols, polyhydroxy compounds, phosphoric compounds, or combinations of the foregoing;

heating said composition to form a carbon-rich layer;

optionally forming one or more additional intermediate layers on said carbon-rich layer, there being an uppermost additional intermediate layer on said carbon-rich layer, if one or more additional intermediate layers are present;

applying an imaging layer to said one or more additional intermediate layers, if present, or to said carbon-rich layer, if no additional intermediate layers are present;

patterning said imaging layer to form a pattern therein;

transferring said pattern to said one or more additional intermediate layers on said carbon-rich layer, if present, and to said carbon-rich layer; and contacting said carbon-rich layer with SC1.

13. The method of claim 12, wherein said substrate surface comprises an intermediate layer, and said intermediate layer is chosen from TiN or $SiO_2$.

14. The method of claim 12, wherein said carbon-rich layer has the property of being SC1 resistant.

15. The method of claim 12, wherein when said diimide is formed from (i), said composition further comprises a component chosen from:

polyphenols;

polyhydroxy compounds;

phosphoric compounds; or combinations of the foregoing.

16. The method of claim 12, wherein said solvent system comprises propylene glycol monomethyl ether, and said applying said composition is carried out without removing some or all of said propylene glycol monomethyl ether prior to said applying.

17. The method of claim 12, wherein:

said dianhydride is chosen from benzophenone-3,3'4,4'-tetracarboxylic dianhydride, 4,4'-oxydiphthalic dianhydride, 9,9-bis(3,4-dicarboxyphenyl) fluorene dianhydride, or combinations thereof;

said crosslinkable monoamine is chosen from 2-vinylaniline, 4-vinylaniline, 2-allylaniline, 4-allylaniline, 3-ethynylaniline, 4-ethynylaniline, 2-ethynylaniline, or combinations thereof;

said crosslinkable monoanhydride is chosen from 4-methylethynyl phthalic anhydride, 4-phenylethynyl phthalic anhydride, or combinations thereof; and said diamine is chosen from 4,4'-oxydianiline, bis(4-aminophenyl) sulfone, 9,9-bis(4-aminophenyl) fluorene, or combinations thereof.

18. A method of forming a microelectronic structure, said method comprising:

optionally forming one or more intermediate layers on a substrate surface, there being an uppermost intermediate layer on said substrate surface, if one or more intermediate layers are present;

applying a composition to said uppermost intermediate layer, if present, or to said substrate surface, if no intermediate layers are present, said composition comprising a diimide dissolved or dispersed in a solvent system, said diimide formed from a diamic acid formed from:

(i) a dianhydride and a crosslinkable monoamine; or (ii) a crosslinkable monoanhydride chosen from 4-cyclohexene-1,2-dicarboxylic anhydride, 5-norbornene-2,3-dicarboxylic anhydride, 4-methylethynyl phthalic anhydride, 4-phenylethynyl phthalic anhydride, or combinations thereof and a diamine, wherein when said diimide is formed from (ii), said composition further comprises a component chosen from polyphenols, polyhydroxy compounds, phosphoric compounds, or combinations of the foregoing; and heating said composition to form a carbon-rich layer having the property of SC1 resistance.

19. The method of claim 18, wherein said substrate surface comprises an intermediate layer, and said intermediate layer is chosen from TiN or $SiO_2$.

20. The method of claim 18, wherein when said diimide is formed from (i), said composition further comprises a component chosen from:

polyphenols;

polyhydroxy compounds;

phosphoric compounds; or combinations of the foregoing.

21. The method of claim 18, wherein said solvent system comprises propylene glycol monomethyl ether, and said applying said composition is carried out without removing some or all of said propylene glycol monomethyl ether prior to said applying.

22. The method of claim 18, wherein:

said dianhydride is chosen from benzophenone-3,3'4,4'-tetracarboxylic dianhydride, 4,4'-oxydiphthalic dianhydride, 9,9-bis(3,4-dicarboxyphenyl) fluorene dianhydride, or combinations thereof;

said crosslinkable monoamine is chosen from 2-vinylaniline, 4-vinylaniline, 2-allylaniline, 4-allylaniline, 3-ethynylaniline, 4-ethynylaniline, 2-ethynylaniline, or combinations thereof;

said crosslinkable monoanhydride is chosen from 4-methylethynyl phthalic anhydride, 4-phenylethynyl phthalic anhydride, or combinations thereof; and said diamine is chosen from 4,4'-oxydianiline, bis(4-aminophenyl) sulfone, 9,9-bis(4-aminophenyl) fluorene, or combinations thereof.

23. A method of forming a microelectronic structure, said method comprising:

optionally forming one or more intermediate layers on a substrate surface, there being an uppermost intermediate layer on said substrate surface, if one or more intermediate layers are present;

applying a composition to said uppermost intermediate layer, if present, or to said substrate surface, if no intermediate layers are present, said composition comprising a diimide and a component dissolved or dispersed in a solvent system, wherein:

said component is chosen from:

polyphenols comprising at least four phenol rings;

polyhydroxy compounds;

phosphoric compounds; or combinations of the foregoing; and said diimide is formed from a diamic acid formed from:

(i) a dianhydride and a crosslinkable monoamine; or (ii) a crosslinkable monoanhydride chosen from 4-cyclohexene-1,2-dicarboxylic anhydride, 5-norbornene-2,3-dicarboxylic anhydride, 4-methylethynyl phthalic anhydride, 4-phenylethynyl phthalic anhydride, or combinations thereof and a diamine;

heating said composition to form a carbon-rich layer.

24. The method of claim 23, wherein said substrate surface comprises an intermediate layer, and said intermediate layer is chosen from TiN or $SiO_2$.

25. The method of claim 23, wherein said solvent system comprises propylene glycol monomethyl ether, and said applying said composition is carried out without removing some or all of said propylene glycol monomethyl ether prior to said applying.

26. The method of claim 23, wherein:

said dianhydride is chosen from benzophenone-3,3'4,4'-tetracarboxylic dianhydride, 4,4'-oxydiphthalic dianhydride, 9,9-bis(3,4-dicarboxyphenyl) fluorene dianhydride, or combinations thereof;

said crosslinkable monoamine is chosen from 2-vinylaniline, 4-vinylaniline, 2-allylaniline, 4-allylaniline, 3-ethynylaniline, 4-ethynylaniline, 2-ethynylaniline, or combinations thereof;

said crosslinkable monoanhydride is chosen from 4-methylethynyl phthalic anhydride, 4-phenylethynyl phthalic anhydride, or combinations thereof; and said diamine is chosen from 4,4'-oxydianiline, bis(4-aminophenyl) sulfone, 9,9-bis(4-aminophenyl) fluorene, or combinations thereof.

27. The method of claim 23, wherein:

said polyphenol is

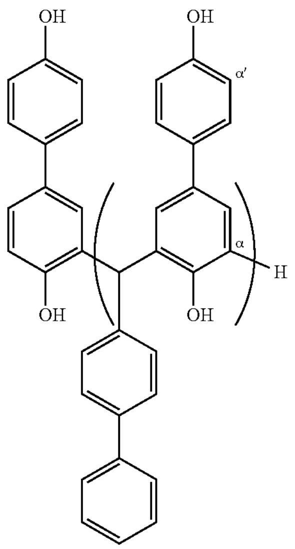

where n is 1 to 5 and the molecular chain may be bonded to carbon α' instead of, or in addition to, carbon α;

said polyhydroxy compound is chosen from gallic acid, methyl gallate, 4-hydroxybenzoic acid, pyrogallol, 2,3,4,3',4',5'-hexahydroxybenzophenone, boronated polystyrene, 3,3',5,5'-tetrakis (methoxymethyl)-[1,1'-biphenyl]-4,4'-diol, poly (4-vinyl phenol), or combinations thereof; and said phosphoric compound is chosen from phenylbis (2,4,6-trimethylbenzoyl) phosphine oxide, and dimethyl phenyl phosphonate, phenyl phosphate, phenyl phosphonic acid, phytic acid, or combinations thereof.

28. A method of forming a microelectronic structure, said method comprising:

imidizing a diamic acid in a solvent system comprising propylene glycol monomethyl ether so as to form a composition comprising a diimide, said diamic acid being formed from (i) a dianhydride and a crosslinkable monoamine; or (ii) a crosslinkable monoanhydride chosen from 4-cyclohexene-1,2-dicarboxylic anhydride, 5-norbornene-2,3-dicarboxylic anhydride, 4-methylethynyl phthalic anhydride, 4-phenylethynyl phthalic anhydride, or combinations thereof and a diamine, wherein when said diimide is formed from (ii), said composition further comprises a component chosen from polyphenols, polyhydroxy compounds, phosphoric compounds, or combinations of the foregoing;

optionally forming one or more intermediate layers on a substrate surface, there being an uppermost intermediate layer on said substrate surface, if one or more intermediate layers are present;

without removing some or all of said propylene glycol monomethyl ether, applying said composition to said uppermost intermediate layer, if present, or to said substrate surface, if no intermediate layers are present, said composition; and heating said composition to form a carbon-rich layer.

29. The method of claim 28, further comprising:

optionally forming one or more additional intermediate layers on said carbon-rich layer, there being an uppermost additional intermediate layer on said carbon-rich layer, if one or more additional intermediate layers are present;

applying an imaging layer to said one or more additional intermediate layers, if present, or to said carbon-rich layer, if no additional intermediate layers are present;

patterning said imaging layer to form a pattern therein;

transferring said pattern to said one or more additional intermediate layers on said carbon-rich layer, if present, and to said carbon-rich layer; and contacting said carbon-rich layer with SC1.

30. The method of claim 28, wherein said substrate surface comprises an intermediate layer, and said intermediate layer is chosen from TiN or $SiO_2$.

31. The method of claim 28, wherein:

said dianhydride is chosen from benzophenone-3,3'4,4'-tetracarboxylic dianhydride, 4,4'-oxydiphthalic dianhydride, 9,9-bis(3,4-dicarboxyphenyl) fluorene dianhydride, or combinations thereof;

said crosslinkable monoamine is chosen from 2-vinylaniline, 4-vinylaniline, 2-allylaniline, 4-allylaniline, 3-ethynylaniline, 4-ethynylaniline, 2-ethynylaniline or combinations thereof;

said crosslinkable monoanhydride is chosen from 4-methylethynyl phthalic anhydride, 4-phenylethynyl phthalic anhydride, or combinations thereof; and said diamine is chosen from 4,4'-oxydianiline, bis(4-aminophenyl) sulfone, 9,9-bis(4-aminophenyl) fluorene, or combinations thereof.

32. A composition comprising:

a diimide formed from a diamic acid formed from:

(i) a dianhydride and a crosslinkable monoamine; or (ii) a crosslinkable monoanhydride chosen from 4-cyclohexene-1,2-dicarboxylic anhydride, 5-norbornene-2,3-dicarboxylic anhydride, 4-methylethynyl phthalic anhydride, 4-phenylethynyl phthalic anhydride, or combinations thereof and a diamine;

a component chosen from:

polyphenols comprising at least four phenol rings;

polyhydroxy compounds;

phosphoric compounds; or combinations of the foregoing; and a solvent system.

33. The composition of claim 32, wherein said solvent system comprises propylene glycol monomethyl ether.

34. The composition of claim 32, wherein:

said dianhydride is chosen from benzophenone-3,3'4,4'-tetracarboxylic dianhydride, 4,4'-oxydiphthalic dianhydride, 9,9-bis(3,4-dicarboxyphenyl) fluorene dianhydride, or combinations thereof;

said crosslinkable monoamine is chosen from 2-vinylaniline, 4-vinylaniline, 2-allylaniline, 4-allylaniline, 3-ethynylaniline, 4-ethynylaniline, 2-ethynylaniline, or combinations thereof;

said crosslinkable monoanhydride is chosen from 4-methylethynyl phthalic anhydride, 4-phenylethynyl phthalic anhydride, or combinations thereof; and said diamine is chosen from 4,4'-oxydianiline, bis(4-aminophenyl) sulfone, 9,9-bis(4-aminophenyl) fluorene, or combinations thereof.

35. The composition of claim 32, wherein:

said polyphenols are chosen from

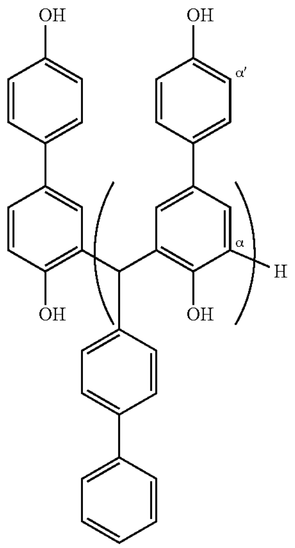

where n is 1 to 5 and the molecular chain may be bonded to carbon α' instead of, or in addition to, carbon α;

said polyhydroxy compounds are chosen from gallic acid, methyl gallate, 4-hydroxybenzoic acid, pyrogallol, 2,3,4,3',4',5'-hexahydroxybenzophenone, boronated polystyrene, 3,3',5,5'-tetrakis (methoxymethyl)-[1,1'-biphenyl]-4,4'-diol, and poly (4-vinyl phenol), or combinations thereof; and said phosphoric compounds are chosen from phenylbis (2,4,6-trimethylbenzoyl) phosphine oxide, and dimethyl phenyl phosphonate, phenyl phosphate, phenyl phosphonic acid, phytic acid, or combinations thereof.

36. A microelectronic structure comprising:

a microelectronic substrate having a surface;

optionally one or more intermediate layers on said substrate surface, there being an uppermost intermediate layer on said substrate surface, if one or more intermediate layers are present;

a layer of a composition on said uppermost intermediate layer, if present, or on said substrate surface, if no intermediate layers are present, said composition comprising:

a diimide formed from a diamic acid formed from:

(i) a dianhydride and a crosslinkable monoamine; or (ii) a crosslinkable monoanhydride chosen from 4-cyclohexene-1,2-dicarboxylic anhydride, 5-norbornene-2,3-dicarboxylic anhydride, 4-methylethynyl phthalic anhydride, 4-phenylethynyl phthalic anhydride, or combinations thereof and a diamine;

a component chosen from:

polyphenols comprising at least four phenol rings;

polyhydroxy compounds;

phosphoric compounds; or combinations of the foregoing; and a solvent system.

37. The structure of claim 36, wherein said substrate surface comprises an intermediate layer, and said intermediate layer is chosen from TiN or $SiO_2$.

38. The structure of claim 36, wherein said solvent system comprises propylene glycol monomethyl ether.

39. The structure of claim 36, wherein:

said dianhydride is chosen from benzophenone-3,3'4,4'-tetracarboxylic dianhydride, 4,4'-oxydiphthalic dianhydride, 9,9-bis(3,4-dicarboxyphenyl) fluorene dianhydride, or combinations thereof;

said crosslinkable monoamine is chosen from 2-vinylaniline, 4-vinylaniline, 2-allylaniline, 4-allylaniline, 3-ethynylaniline, 4-ethynylaniline, 2-ethynylaniline, or combinations thereof;

said crosslinkable monoanhydride is chosen from 4-methylethynyl phthalic anhydride, 4-phenylethynyl phthalic anhydride, or combinations thereof; and said diamine is chosen from 4,4'-oxydianiline, bis(4-aminophenyl) sulfone, 9,9-bis(4-aminophenyl) fluorene, or combinations thereof.

40. A microelectronic structure comprising:

a microelectronic substrate having a surface;

optionally one or more intermediate layers on said substrate surface, there being an uppermost intermediate layer on said substrate surface, if one or more intermediate layers are present;

a carbon-rich layer on said uppermost intermediate layer, if present, or on said substrate surface, if no intermediate layers are present, said carbon-rich layer comprising:

a crosslinked diimide formed from a diamic acid formed from:

(i) a dianhydride and a crosslinkable monoamine; or (ii) a crosslinkable monoanhydride chosen from 4-cyclohexene-1,2-dicarboxylic anhydride, 5-norbornene-2,3-dicarboxylic anhydride, 4-methylethynyl phthalic anhydride, 4-phenylethynyl phthalic anhydride, or combinations thereof and a diamine;

and a component chosen from:

polyphenols comprising at least four phenol rings;

polyhydroxy compounds;

phosphoric compounds; or combinations of the foregoing.

41. The structure of claim 40, wherein said substrate surface comprises an intermediate layer, and said intermediate layer is chosen from TiN or $SiO_2$.

42. The structure of claim 40, wherein:

said dianhydride is chosen from benzophenone-3,3'4,4'-tetracarboxylic dianhydride, 4,4'-oxydiphthalic dianhydride, 9,9-bis(3,4-dicarboxyphenyl) fluorene dianhydride, or combinations thereof;

said crosslinkable monoamine is chosen from 2-vinylaniline, 4-vinylaniline, 2-allylaniline, 4-allylaniline, 3-ethynylaniline, 4-ethynylaniline, 2-ethynylaniline, or combinations thereof;

said crosslinkable monoanhydride is chosen from 4-methylethynyl phthalic anhydride, 4-phenylethynyl phthalic anhydride, or combinations thereof; and said diamine is chosen from 4,4'-oxydianiline, bis(4-aminophenyl) sulfone, 9,9-bis(4-aminophenyl) fluorene, or combinations thereof.

43. The structure of claim 40, further comprising:

one or more additional intermediate layers on said carbon-rich layer, there being an uppermost additional intermediate layer on said carbon-rich layer, if one or more additional intermediate layers are present; and an imaging layer on said one or more additional intermediate layers, if present, or on said carbon-rich layer, if no additional intermediate layers are present.

* * * * *